(12) United States Patent
Niebojewski et al.

(10) Patent No.: US 8,980,702 B2
(45) Date of Patent: Mar. 17, 2015

(54) METHOD OF MAKING A TRANSISTOR

(71) Applicants: Commissariat a l'Energie Atomique et aux ene Alt, Paris (FR); STMicroelectronics (Crolles 2) SAS, Crolles (FR); STMicroelectronics SA, Montrouge (FR)

(72) Inventors: Heimanu Niebojewski, Grenoble (FR); Yves Morand, Grenoble (FR); Maud Vinet, Rives (FR)

(73) Assignees: Commissariat a l'Energie Atomique et aux Energies Alternatives, Paris (FR); STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 14/177,614

(22) Filed: Feb. 11, 2014

(65) Prior Publication Data
US 2014/0335663 A1 Nov. 13, 2014

(30) Foreign Application Priority Data
Feb. 11, 2013 (FR) ...................................... 13 51140

(51) Int. Cl.
*H01L 21/00* (2006.01)
*H01L 29/66* (2006.01)
*H01L 29/78* (2006.01)

(52) U.S. Cl.
CPC .......... *H01L 29/66477* (2013.01); *H01L 29/78* (2013.01)
USPC ............................ 438/151; 438/154; 438/300

(58) Field of Classification Search
USPC .......................... 438/151, 154, 199, 299, 300
See application file for complete search history.

(56) References Cited

U.S. PATENT DOCUMENTS 6,020,615 A    2/2000  Lee
6,232,155 B1   5/2001  Lee (Continued)

FOREIGN PATENT DOCUMENTS

DE    101 45 699 A1    4/2003
FR    2 938 202 A1    5/2010

(Continued)

OTHER PUBLICATIONS

French Preliminary Search Report issued Sep. 16, 2013 in Patent Application No. 1351144 (with English translation of Categories of Cited Documents).

(Continued)

*Primary Examiner* — Kevin M Picardat
(74) *Attorney, Agent, or Firm* — Oblon, Spivak, McClelland, Maier & Neustadt, L.L.P.

(57) ABSTRACT

A method for manufacturing a transistor includes forming a stack of semiconductor on insulator type layers including at least one substrate, surmounted by a first insulating layer and an active layer to form a channel for the transistor; forming a gate stack on the active layer; producing a source and a drain including forming, on either side of the gate stack, cavities by at least one step of etching the active layer, the first insulating layer, and part of the substrate selectively to the gate stack to remove the active layer, the first insulating layer, and a portion of the substrate outside regions situated below the gate stack; forming a second insulating layer on the bared surfaces of the substrate, to form a continuous insulating layer with the first insulating layer; baring of the lateral ends of the channel; and the filling of the cavities by epitaxy.

32 Claims, 21 Drawing Sheets

(56) References Cited

U.S. PATENT DOCUMENTS

| | | | |
|---|---|---|---|
| 6,300,218 | B1 | 10/2001 | Cohen et al. |
| 6,468,880 | B1 | 10/2002 | Lim et al. |
| 6,593,205 | B1 | 7/2003 | Cheng et al. |
| 6,756,257 | B2 | 6/2004 | Davari et al. |
| 7,741,673 | B2 * | 6/2010 | Tak et al. ............... 257/315 |
| 7,829,421 | B2 * | 11/2010 | Wei et al. ............... 438/300 |
| 7,955,917 | B2 * | 6/2011 | Hanafi ..................... 438/183 |
| 8,633,096 | B2 * | 1/2014 | Greene et al. ............ 438/530 |
| 2006/0022270 | A1 | 2/2006 | Boyd et al. |
| 2006/0094182 | A1 | 5/2006 | Hanafi et al. |
| 2007/0166890 | A1 | 7/2007 | Cheng et al. |
| 2007/0278591 | A1 | 12/2007 | Luo et al. |
| 2009/0227082 | A1 * | 9/2009 | Shin et al. .............. 438/294 |
| 2010/0219474 | A1 * | 9/2010 | Kronholz et al. ........ 257/347 |
| 2012/0273886 | A1 | 11/2012 | Zhong et al. |
| 2013/0244393 | A1 * | 9/2013 | Zhong et al. ............ 438/300 |

FOREIGN PATENT DOCUMENTS

| | | |
|---|---|---|
| JP | 2004-296744 A | 10/2004 |
| WO | WO 2010/049654 A1 | 5/2010 |

OTHER PUBLICATIONS

French Preliminary Search Report issued Aug. 27, 2013 in Patent Application No. 1351142 (with English translation of Categories of Cited Documents).

A. Baghizadeh, et al., "Formation of As enriched layer by steam oxidation of As+-implanted Si" Applied Surface Science, vol. 255, 2009, pp. 5857-5860.

M. Bauer, et al., "Low temperature Si:C co-flow and hybrid process using $Si_3H_8/Cl_2$," Thin Solid Films, vol. 520, 2012, pp. 3133-3138.

Erich Biermann, et al., "Oxide Growth Enhancement on Highly n-Type Doped Silicon under Steam Oxidation" J. Electrochem. Soc., vol. 143, No. 4, Apr. 1996, pp. 1434-1442.

B. E. Deal, et al., "Thermal Oxidation of Heavily Doped Silicon" Journal of the Electrochemical Society, vol. 112, No. 4, Apr. 1965, pp. 430-435.

E. Biermann, "Silicon Oxidation Rate Dependence on Dopant Pile-up" IEEE, 1989, 1 Page.

Yong-Hoon Son, et al., "Laser-induced Epitaxial Growth (LEG) Technology for High Density 3-D Stacked Memory with High Productivity" IEEE Xplore, VLSI Technology, 2007, 1 Page.

Chunshan Yin, et al., "Investigation of the source/drain asymmetric effects due to gate misalignment in planar double-gate MOSFETs" IEEE Xplore, Electronic Devices, vol. 52, No. 1, Jan. 2005, 1 Page.

K. Cheng, et al. "Fully Depleted Extremely Thin SOI Technology Fabricated by a Novel Integration Scheme Featuring Implant-Free, Zero-Silicon-Loss, and Faceted Raised Source/Drain" VLSI Technology, Jun. 16-18, 2009, 1 Page.

French Preliminary Search Report and Written Opinion issued Aug. 15, 2013, in Patent Application No. FR 1351140, filed Feb. 11, 2013 (with English Translation of Category of Cited Documents).

* cited by examiner

Prior Art

US 8,980,702 B2

METHOD OF MAKING A TRANSISTOR

TECHNICAL FIELD OF THE INVENTION

The present invention relates in general to the transistors of metal oxide semiconductor type with field effects (MOSFET) and more particularly to the reduction of parasitic factors that limit their operating speed and increase their consumption.

PRIOR ART

The maximum switching rate of a MOSFET (Metal-Oxide-Semiconductor Field-Effect Transistor) transistor depends on the speed with which the conduction current can be effectively established and made to disappear. Among other factors, it depends on numerous physical parameters specific to the materials used, for example the mobility of carriers of the semiconductor material employed and the levels and type of doping of the different zones defining the electrodes. The switching rate also depends largely on the geometry and structure of the transistors. In particular, by the presence of parasitic factors that are inevitably introduced by the practical manufacture of these devices. Two particularly critical parasitic factors are on the one hand the series access resistance of the source and drain electrodes and on the other hand the parasitic capacitance between gate and source or drain. These parasitic factors form a time constant that contributes to limiting the maximum switching rate of every transistor.

FIG. 1 shows a cross-sectional view of a MOSFET transistor 100 characteristic of the current state of the art. More and more integrated circuits are currently manufactured from prepared substrates of the type known as SOI, the English acronym for "silicon on insulator", in other words "silicon on insulation" and more generally "semiconductor on insulation". FIG. 1 shows the starting SOI substrate 110, which is constituted of an initial substrate 112, most often a homogeneous silicon wafer, and of a buried oxide layer 114, which assures insulation of components that will be fabricated in the thin surface layer 116 of semiconductor present on the buried layer. Surface layer 116 is most often constituted of monocrystalline silicon. The insulation of each of transistors 100 is supplemented by the formation of lateral insulation trenches known as STI, the English acronym for "shallow trench isolation", in other words "insulating trenches of small depth". They extend to the buried oxide layer to enclose each of the transistors in a continuous oxide layer. These trenches, which are not necessary to the understanding of the invention, are not represented.

FIG. 2 summarizes the main standard steps of fabrication of a MOSFET transistor on a SOI substrate representative of the prior art. First step 810 consists in producing, from starting SOI substrate 110, the insulating trenches STI, which will make it possible to assure complete insulation of each of the transistors 100. In the following global step 820, layers and patterns are stacked to constitute the stack of layers of gate 160 of each transistor, which gate comprises two main layers: thin gate oxide 122 and control gate 124. The latter is made of conductive polycrystalline silicon, which functions as the metal in the MOS structure of the transistor, or of a stack of layers constituted of a metal and of polysilicon. In the following step 830, a first layer of spacers 130 is formed on the sidewalls of each gate pattern. The spacers, made of silicon nitride, and the gate itself, will function to protect channel 180 during a subsequent first operation of implantation of the surface layer of silicon. It will be noted here that the spacers and the sources and drains are formed without employing any photolithography operation. As mentioned hereinabove, a first implantation 840 of zones of source and drain 140 in surface layer 116, generally made of monocrystalline silicon, is then carried out. In the description hereinafter of the invention, the source and drain electrodes are not differentiated and are denoted by the same acronym, "S/D" 140.

The ensuing step 850 of the standard method for production of a transistor in conformity with FIG. 1 consists in increasing the thickness 142 of the source and drain (S/D) zones. The main objective of this operation is to reduce the access resistances 145 of these electrodes. The thickening of S/D zones is traditionally achieved by epitaxial growth starting from the underlying layer, in other words layer 116 of monocrystalline silicon of the starting SOI substrate. It therefore involves decreasing one of the parasitic factors mentioned in the foregoing, which factors limit the switching rate and the performances of the transistors. Because it is known that the access resistance is inversely proportional to the thickness of the S/Ds, it will be noted here that increased raising of the S/Ds is of great interest for significantly reducing this parasitic factor. This type of transistor and method is often referred to as "RSD", the English acronym for "raised source drain", in other words "elevated source drain".

The other standard operations consist in a step 860 of producing a second layer of spacers 150. This second layer of spacers functions to limit the silicidation zones laterally around the gate pattern, thus making it possible to assure good electrical contact with the silicon of raised S/Ds 140. Silicidation 123 and metal contacts 870 are formed in step 280. Prior to this, a second implantation of the S/Ds is performed in step 870 which assures doping of these zones. As for the S/Ds, it will be noted that silicidation of the high part of the stack of layers of gate 160 made of polycrystalline silicon is also achieved in order to establish good electrical contact on this electrode. For clarity, however, the gate contact and its silicidated zone are not represented in FIG. 1.

The other parasitic factor mentioned in the foregoing is the capacitance 190 between the S/Ds and the gate. The spacers constitute the dielectric of this capacitance. The parasitic capacitance due to the spacers tends to increase in proportion to the growth of thickness 142 of the raised epitaxial layer of S/Ds 140. In this way it is observed that, in the standard method for production of MOSFET transistors that has just been briefly described, the conditions of optimization of the main parasitic factors that limit their switching speed are perfectly opposed, since to decrease one, the access resistance of source and drain 140, it is necessary to increase the raising thereof, thus leading to an increase of the other parasitic factor, in other words the capacitance 190 between the gate and the S/Ds 140.

Different techniques have been proposed to compensate for the increase of parasitic capacitance between the gate and the S/Ds 140. A first method consists in using spacers wherein the material has lower permittivity than that of the silicon nitride currently used. For example, replacement of the nitride by silicon oxide makes it possible to reduce the value of the parasitic capacitance significantly.

However, the replacement of the nitride seriously complicates the standard method of fabrication of MOSFET transistors. This replacement may be achieved by providing for supplementary steps, in the course of which the nitride that normally provided protection is finally stripped, in order to permit self-alignment of the S/Ds on the gate, as explained in the foregoing. The nitride is then replaced in the final device by silicon oxide, with the advantage of a decrease of parasitic capacitance 190. This solution therefore has the drawback of adding additional and delicate steps to the standard method.

The standard method may also be modified by providing for the direct use of silicon oxide spacers. However, this material is much less suitable than the nitride for forming spacers, and at present an industrially reliable method permitting direct replacement of the nitride does not exist.

Another method that has been tried experimentally is that in which the epitaxial growth that permits raised S/Ds to be obtained in order to decrease the access resistance of these electrodes is achieved by limiting the lateral growth of this epitaxy in order to increase the distance of S/D zones 140 from the gate and therefore to decrease a parasitic capacitance 190 by increasing the thickness of dielectric between these zones. However, this technique, known as "faceted epitaxy", is particularly difficult to control. The thickness of silicon deposited during the growth of faceted epitaxy is very sensitive to the environment. Thus there are disparities of thickness between broad and narrow devices that may induce dysfunctioning such as total silicidation and development of leakage currents that seriously harm the reliability of the devices. Disparities of thickness are also observed between the zones in which the density of patterns is great and those in which it is slight.

From this brief presentation of known methods for manufacture of MOSFET transistors, it is apparent that there is no simple and reliable solution which allows to reduce both the access resistance of the source and drain electrodes and at the same time the parasitic capacitance between these electrodes and the control gate.

The objective of the present invention is to propose a solution that addresses at least some of these constraints.

The other objects, characteristics and advantages of the present invention will become apparent upon examination of the description hereinafter and of the accompanying drawings. It is understood that other advantages may be incorporated.

SUMMARY OF THE INVENTION

The subject matter of the present invention is a method for manufacturing a transistor comprising the formation of a stack of layers of the semiconductor on insulator type comprising at least one substrate, also referred to as a bulk substrate, surmounted by a first insulating layer also referred to as the initial insulating layer and an active layer intended to form a channel for the transistor, the method further comprising the formation of a gate stack on the active layer and the production of a source and drain. The production of the source and drain comprises at least the following steps:

the formation, on either side of the gate stack, of cavities obtained by at least one step of etching the active layer, from the first insulating layer selectively to the gate stack at least so as to remove the active layer, the initial insulating layer outside regions situated below the gate stack;

the formation of a second insulating layer, also referred to as the re-formed insulating layer, comprising the formation of an insulating film on the surfaces of the substrate bared by said etching and on any surfaces left bare of the active layer, so that said insulating film forms, with the first initial layer remaining after etching, an insulating layer continuous from one cavity to the other of the transistor; thus the continuous insulating layer covers all the walls of the cavities.

The formation of this insulating film is significantly easier and more precise than an implantation of oxygen in the thickness of a layer and at different depths. This is because it is difficult to precisely control the depth of an implantation.

Furthermore, oxidation can be achieved over the entire wafer, without prior lithography, thus making it possible to increase the reliability and the precision of the method.

the filling of the cavities by a semiconductor material so as to form the source and drain, the filling being effected preferably by at least one epitaxy and after optionally a step of baring the lateral ends of the channel.

The invention thus proposes a particularly simple method for forming buried S/Ds at least partly under the channel, by etching cavities beyond the initial insulating layer of a semiconductor on insulator substrate. The openings thus formed in the substrate are electrically insulated from the active regions and the source and drain are then formed below the gate.

Both the source and drain extend to a major part at least under the active layer and in the cavity hollowed out under the initial insulating layer. Thus the transistor has a very special structure in which the source and/or drain are reversed compared with the known structures, that is to say they are buried under the channel and under the top face of the initial insulating layer underlying the channel. This structure reduces the parasitic capacitance between the gate and the source and drain. Furthermore, it makes it possible to thicken the source and drain in a direction perpendicular to the plane of the substrate, which has the effect of reducing the access resistance of the electrodes of the source and drain.

Also advantageously, the invention makes it possible to make the height of the gate independent with respect to the height of the source and drain, which makes it possible in particular to reduce the height of the gate.

Another significant advantage of the present invention lies in the fact that the cavities are formed in the active layer and in the channel by selective etching of the gate. The cavities are thus auto-aligned on the gate. Defects in alignment are therefore eliminated. The method is particularly simple, reliable and easily reproducible.

Another significant advantage of the present invention lies in the fact that the height of the S/Ds is independent of the thickness of the active layer forming the channel. This advantage is of interest for very many applications and in particular for transistors where the channel has a very low thickness, such as transistors of the FDSOI (fully depleted SOI) type for example. This is because the invention makes it possible to preserve a very thin channel while deciding freely on the S/D height, for example by increasing it for the purpose of reducing the access resistance of the S/Ds without increasing the parasitic capacitance between S/D and gate.

The invention thus makes it possible to thus propose a particularly effective solution for solving the following problem: offering a solution for reducing the access resistance of the electrodes of the S/Ds without degrading the performance of the transistor, particularly in terms of speed.

The present invention is particularly suited to substrates of the semiconductor on insulator type, such as elaborate substrates of the silicon on insulator (SOI) type with a thin buried oxide layer (buried insulating oxide, BOX). In a case with a thin buried oxide layer, it is intended for the thickness of the buried oxide layer to be between 145 and 5 nm (nanometers), preferably between 25 and 5 nm without this being limitative. The advantage of the invention is that the embodiments do not depend on the thickness of the buried oxide layer. If a reduction in the thickness of the buried oxide layer is required, for example to provide better electrostatics of the transistor, the invention remains perfectly applicable.

Another subject matter of the present invention concerns a transistor comprising a stack of layers comprising at least and preferably only: an active layer intended to form a channel for the transistor, an insulating layer disposed opposite a lower face of the channel and on an upper face of a substrate, a gate stack turned facing an upper face of the channel and a source and drain disposed on either side of the gate stack and extending at least partially, preferably mainly and even more preferentially entirely, under the upper face of the channel and/or under the gate stack. The source and drain are disposed in cavities situated on either side of the gate stack. The insulating layer forms an uninterrupted layer between the two cavities of the transistor. The insulating layer has a bottom face, the distance of which with respect to a bottom face of the substrate is greater under the gate stack than in the cavities.

This transistor structure has the advantage of having a source and drain that are not facing the gate while having a thickness of the insulating layer that is as thin as desired under the channel and source and drain insulated from the substrate by dielectric insulation. This thus makes it possible to particularly significantly reduce the stray capacitances between the gate and the source and drain at a minimum, and to thicken the source and drain in a direction perpendicular to the plane of the substrate, which has the effect of reducing the access resistance of the electrodes of the source and drain.

Preferably, the distance d1 between a bottom face of the insulating layer and a bottom face of the substrate measured under the gate stack is greater than the distance d2 between the bottom face of the insulating layer and the bottom face of the substrate measured at a cavity.

Also advantageously, this structure may have an insulating layer with a substantially uniform thickness on the surface of the substrate. By way of non-limitative example, the thickness of the insulating layer is between 10 and 50 nm. Advantageously this thickness is small, typically less than 25 nm, while having good homogeneity of thickness. The thickness is taken perpendicular to the plane of the bottom face of the substrate.

BRIEF DESCRIPTION OF THE FIGURES

The aims, objects and features and advantages of the invention will emerge more clearly from the detailed description of an embodiment of the latter that is illustrated by the following accompanying drawings, in which.

Figure 1:
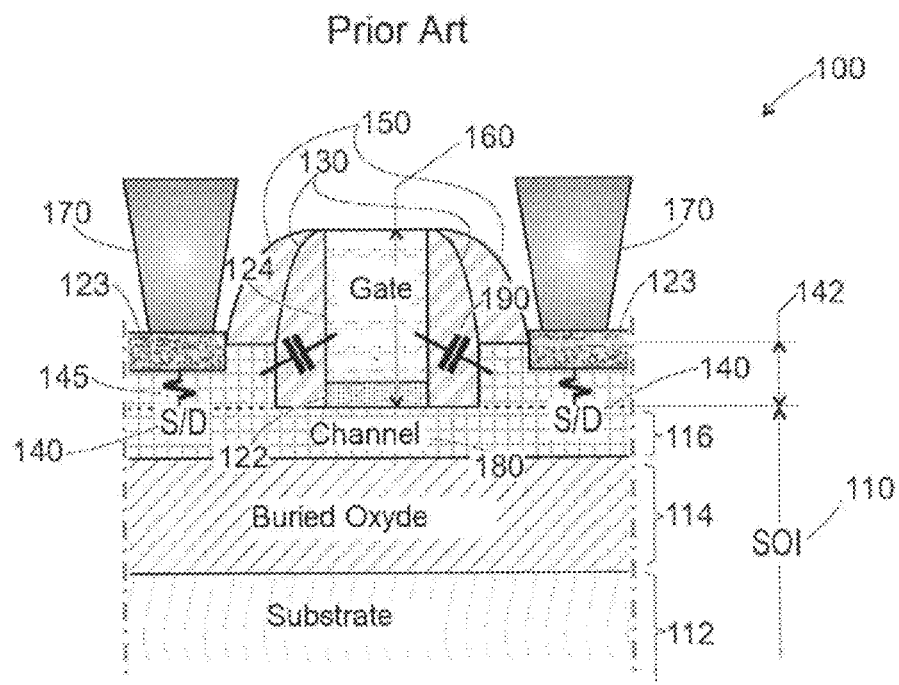
FIG. 1 shows a view in cross section of a MOSFET transistor characteristic of the prior art.
Figure 2:
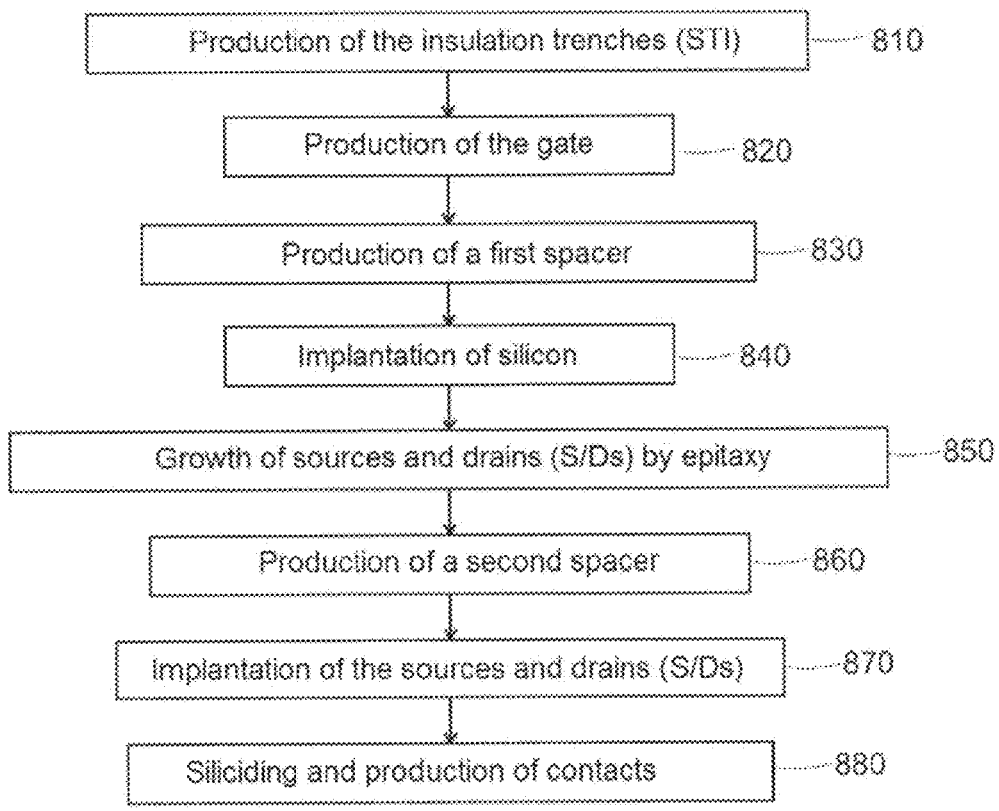
FIG. 2 summarises the main standard steps of manufacturing a MOSFET transistor representing the prior art.

The drawings are given by way of examples and are not limitative of the invention. They constitute outline schematic representations intended to facilitate understanding of the invention and are not necessarily to the scale of practical applications. In particular the relative thicknesses of the various layers and films are not representative of reality.

DETAILED DESCRIPTION OF THE INVENTION

Before beginning a detailed review of embodiments of the invention, the optional features that may optionally be used in association or alternatively are stated below:

It is stated first of all that the invention relates to a transistor manufacturing method comprising the formation of a stack of layers of the semiconductor on insulator type comprising at least one substrate, surmounted by an initial insulating layer (also referred to as the first layer) and an active layer intended to form a channel for the transistor, the method further comprising the formation of a gate stack on the active layer and the production of a source and drain. The production of the source and drain comprises at least the following steps: the formation, on either side of the gate stack, of cavities obtained by at least one step of etching the active layer, the initial insulating layer and a substrate part selectively to the gate stack at least so as to remove the active layer, the initial insulating layer and a portion of the substrate outside regions situated below the gate stack; the re-formation of an insulating layer (also referred to as the second layer) comprising the formation of an insulating film on the surfaces of a substrate bared by said etching, so that the insulating film forms, with the initial insulating layer, an insulating layer uninterrupted from one cavity to another of the transistor; thus an insulating layer covers all the walls of the cavities; the filling of the cavities with a semiconductor material so as to form the source and drain.

Preferably, the etching of the active layer, the insulating layer and the substrate is done over the entire surface of the active layer with the exception of the regions disposed under the gate stack and optionally with the exception of the regions disposed under one or more of the optional spacers covering the flanks of the gate stack and with the exception of the insulation regions, for example of the STI (shallow insulation trench) type. These spacers are considered to belong to the gate stack.

Advantageously, the re-formation of an insulating layer on the surface of the substrate is done by oxidation of the substrate at least from the surface thereof. Preferably the oxidation is a thermal oxidation.

Preferably, the cavities are filled by epitaxy from the lateral ends of the channel. Prior to the epitaxy, the lateral ends of the channel are bared.

Preferably, the re-formed insulating layer is uninterrupted over the whole of the wafer or at least for a plurality of transistors. The initial insulating layer remains under the gates and the additional insulating layer forming, with the initial insulating layer, an uninterrupted layer is present on the non-re-covered active gate regions.

Preferably, the re-formed insulating layer is uninterrupted but may nevertheless have non-homogeneity of thicknesses from one cavity to another. The re-formation of an insulating layer keeps the presence of cavities. The oxidation of the substrate forms an insulating film on the surfaces of the substrate bared by the etching. This insulating film is in contact with the portion of the initial insulating layer that is situated under the gate stack and which therefore has not disappeared during etching. The insulating film and the remaining portions of the initial insulating layer form an uninterrupted insulating layer from one cavity to another of the transistor. The insulating film is formed, typically by oxidation, in the bottom of the cavities and optionally on the vertical walls of the substrate.

According to a preferred embodiment, the formation of the cavities also comprises the etching of a thickness of the substrate.

Advantageously, the cavities each have a bottom formed by the substrate and the cavities are filled from the channel towards the bottom of the cavities. Advantageously, this prevents the source and drain regions being opposite the gate.

Advantageously, the filling is done so that the source and drain regions extend solely in a plane situated below the gate.

Preferably, the method comprises, after the step of oxidizing the substrate, a step of partial etching of the insulating layer re-formed by the oxidation step. Preferentially, the epitaxy is performed so that the thickness of the source and drain produced by epitaxy each has a dimension (Ep(epi) substantially equal to Ep(etched1)−0.54·EP(oxide)+Ep(etched2), as illustrated in FIGS. 4b to 4e, where:

Ep(etched1) corresponds to the thickness etched during the formation of the cavities;

0.54·EP(oxide) corresponds to the increase in height associated with the oxidation, that is to say the difference between the thickness of the insulating film formed and the thickness of the semiconductor, typically silicon, consumed to manufacture this insulating film;

Ep(etched2) corresponds to the thickness etched during the step of partial etching of the re-formed insulating layer.

Preferably, Ep(epi)<1.3·Ep(etched1)−0.54·EP(oxide)+Ep(etched2).

Preferably, Ep(epi)>0.8·Ep(etched1)−0.54·EP(oxide)+Ep(etched2).

Preferably, Ep(epi)=Ep(etched1)−0.54·EP(oxide)+Ep(etched2).

Preferably, the step of forming a cavity in the initial insulating layer and the substrate is performed so as to form a cavity the depth of which is to be chosen according to the dimension of the source and drain defined by epitaxy, so as to avoid the formation of voids under the epitaxy and taking account of considerations of electrical performance such as the sizing of the access resistances compared with the specifications. The deeper the cavity, the greater the chances of forming a void. Preferably, in order to form said cavity, an anisotropic or isotropic etching is carried out.

According to one embodiment, the formation of a second insulating layer comprises the formation by oxidation of the substrate of an insulating film on all the bared surfaces of the substrate and of the active layer situated below the gate stack so that the insulating film forms, with the first insulating layer, an insulating layer continuous from one cavity of the transistor to another.

According to some embodiments, the step of re-forming an insulating layer by oxidation of the substrate comprises the oxidation of the lateral ends of the channel.

Preferably, the oxidation step is performed so that the oxidised width of the ends of the channel is less than the oxidised thickness of the substrate. The width is taken in a direction parallel to the plane of the lower face of the substrate. The thickness is taken in a direction perpendicular to the plane of the lower face of the substrate.

Preferably, the oxidation step is performed so that the thickness of the oxidised substrate is at least twice as great as the oxidised width of the lateral ends of the channel.

Advantageously, the method comprises, after the oxidation step, a step of isotropic partial etching of the insulating layer re-formed by the oxidation step, the partial etching being performed so as to bare the lateral ends of the channel and so that the re-formed insulating layer remains uninterrupted from one cavity of the transistor to another.

Thus, according to these embodiments, the baring of the lateral ends of the channel takes place by etching of the portions of the channel that were oxidised.

Preferably, the partial etching is a dry or wet isotropic etching. Preferably, the etching is an etching with hydrofluoric acid or in a fluorinated plasma.

Preferably, the partial etching is stopped when the oxidised width of the ends of the channel is consumed. Preferably, the stoppage takes place by calculating the time necessary for the consumption of the oxidised width of the lateral ends of the channel by the etching solution. An oxidised layer therefore remains in place on the substrate. The continuity of the re-formed insulating layer is therefore preserved.

Preferably, the method comprises, prior to the cavity formation step, a step of forming at least one protective layer forming a spacer and disposed on the flanks of the gate, the partial etching of the re-formed insulating layer being selective of said protective layer so that, after the partial etching step, the lateral ends of the channel are recessed with respect to the protective layer.

Advantageously, the protective layer is formed before the step of etching the re-formed insulating layer. Thus, the removal of the layer of oxide on the lateral ends of the channel means that the lateral ends of the channel are recessed with respect to the protective layer. The latter has a wall that overhangs the lateral ends of the channel. The bottom face of the protective layer, substantially parallel to the plane of the substrate, prevents epitaxial growth towards the gate initiated as from the channel. The protective layer therefore tends to direct the epitaxy towards the bottom of the cavities and towards the substrate, that is to say downwards rather than towards the gate, that is to say upwards.

Preferably, the protective layer is disposed in contact with the flanks of the gate.

Advantageously, the oxidation step is performed so that the oxidised width of the lateral ends of the channel is less than or equal to the width of the protective layer disposed on the flanks of the gate.

Advantageously, the method comprises a step of in situ doping of the source and drain formed by epitaxy in the cavities.

According to a particularly advantageous variant embodiment, the step of re-forming an insulating layer comprises a step of thermal oxidation of the substrate preferentially to the channel. Preferably, the substrate has greater doping than the active layer and the doping of the substrate promotes oxidation of the substrate with respect to the oxidation of the channel. Advantageously, an n-type doping with arsenic (As), P or B is provided with a doping level of $1^E 19$ at/cm$^3$ to a few $1^E 20$ at/cm$^3$. More generally, a high doping level is favoured, or even close to the limit of solubility of the material forming the substrate.

Reference can for example be made to the following publications:

Formation of As enriched layer by steam oxidation of As+-implanted Si

A. Baghizadeh, D. Agha-Aligol, D. Fathy, M. Lamehi-Rachti and M. Moradi which appeared in Applied Surface Science 255 (2009) 5857-5860. Oxide Growth Enhancement on Highly n-Type Doped Silicon under Steam Oxidation—Erich Biermann, Horst H. Berger, Peter Linke and Bernt Muller—Institute of Microelectronics, Technical University Berlin, D-1 0623 Berlin, Germany—which appeared in J. Electrochem. Soc., Vol. 143, No. 4, April 1996, The Electrochemical Society, Inc.

Thermal Oxidation of Heavily Doped Silicon, B. E. Deal and M. Sklar, Research & Development Laboratory, Fairchild Semiconductor, Pale Alto, Calif., ECS Vol. 112, No. 4.

According to another particularly advantageous variant embodiment, the step of re-forming an insulating layer comprises the following steps:

after the formation of the cavities, a step of forming at least one sacrificial protective layer masking the flanks of the gate stack, the lateral ends of the channel and of the flanks of the initial insulating layer and of the flanks of the substrate bared by the formation of the cavities if the etching has attacked the substrate, the sacrificial protective layer leaving bare the substrate in the bottom of the cavities. The sacrificial protective layer extending vertically and forming a spacer for the gate. This sacrificial protective layer leaves bare the bottom of the cavities formed by the substrate, the sacrificial protective layer being chosen so as to isolate at least the channel from an electrolytic porosification;

a step of electrolytic porosification of the substrate, preferably by hydrofluoric acid, a step of baring the lateral ends of the channel by removing the sacrificial protective layer, a step of thermal oxidation of the substrate preferentially to the channel.

The oxidation kinetics of the substrate made porous is significantly superior to that of the material constituting the channel. The oxidised thickness of the substrate is therefore greater than the oxidised width of the channel.

The method preferably comprises, prior to the porosification step, a step of doping the substrate.

The method preferably comprises, prior to the step of re-forming an insulating layer, a step of forming a sacrificial protective layer disposed so as to protect at least the lateral ends of the channel and comprising, before the step of filling the cavities, a step of removing the sacrificial protective layer in order to bare the lateral ends of the channel. Thus, according to these embodiments, the baring of the lateral ends of the channel was done by removing the sacrificial protective layer.

Advantageously, the re-formation of an insulating layer comprises a step of oxidising the substrate and the sacrificial protective layer prevents the oxidation of the channel during this oxidation step. The protective layer extends vertically. It covers the flanks of the gate and the flanks of the channel.

Advantageously, the formation of the cavities comprises a step of etching the active layer selective of the gate stack with stoppage of the etching on the surface of the initial insulating layer and a step of etching the initial insulating layer with stoppage on or in the substrate. The step of forming the sacrificial protective layer is performed after the step of etching the active layer and before said step of etching the initial insulating layer.

Advantageously, the oxidation step is performed so that the thickness of the oxidised substrate is at least twice as great as the width of the sacrificial protective layer.

Preferably, the substrate is made from a non-doped semiconductor material. According to an alternative, the substrate is made from a doped semiconductor material. Thus, these embodiments allow the use of a substrate either doped or not, which offers great freedom of method and final structures.

Advantageously, the method comprises, after the oxidation step for re-forming an insulating layer, a step of partial etching of the re-formed insulating layer.

Advantageously, the step of partial etching of the re-formed insulating layer is an isotropic etching and the etched thickness is at least equal to the width of the sacrificial protective layer.

According to one embodiment, the step of removing the sacrificial protective layer is performed before said step of partial etching of the re-formed insulating layer. A method for etching the oxide selective to silicon, typically based on hydrofluoric acid, is implemented. The channel is therefore not impacted by the etching.

According to other embodiments, the step of removing the sacrificial protective layer is performed after said step of partial etching of the re-formed insulating layer.

Preferably, the step of removing the sacrificial protective layer is performed before the step of filling the cavities, the method further comprising, after the step of filling the cavities, a step of formation of at least one spacer on either side of the gate stack and in contact with the gate stack. The gate is thus encapsulated between the spacer and the hard mask.

According to an option, the sacrificial protective layer is disposed directly in contact with the flanks of the gate stack. Thus, the removal of the sacrificial protective layer bares the flanks of the gate stack. Preferably, the flanks of the gate are bared at the start of the filling step, the crystalline structures of the gate and of the channel are different and the step of filling the cavities comprises a plurality of cycles each comprising: an epitaxy initiated from the channel and from the flanks of the gate; an etching of a material in epitaxial growth from the flanks of the gate selectively to the material in epitaxial growth from the channel.

According to another option, the step of forming the sacrificial protective layer, a step of protecting the flanks of the gate comprising an oxidation of the flanks of the gate, the flanks of the gate preserving an oxidised layer during the step of filling the cavities. Advantageously, the filling of the cavities is preferentially done by epitaxy, the layer of oxide formed on the flanks of the gate prevents any epitaxy from the gate.

Preferably, the formation of the gate stack comprises a step of forming a hard mask on a gate made from semiconductor material. The step of protecting the flanks of the gate comprises, after formation of the gate stack and before etching of the active layer, a step of thermal oxidation of the flanks of the gate and of a portion of the active layer, a step of anisotropic etching of the oxide formed during the step of protecting the flanks of the gate selectively to the hard mask so as to remove the oxide layer on the active layer and to keep an oxide layer in line with the hard mask on the flanks of the gate. The anisotropic etching is directed in a direction perpendicular to the plane of the substrate. The oxidised layer of the gate flank is protected by the hard mask.

Preferably, the method comprises, after the step of anisotropic etching to keep a layer of oxide on the flanks of the gate, a step of anisotropic etching of the active gate with stoppage on the initial insulating layer in order to remove the active layer on either side of the gate stack so as to bare the lateral ends of the channel, and then the step of forming the sacrificial protective layer is performed so as to protect the lateral ends of the channel during the etching of the initial insulating layer in order to form the cavities and during the step of re-forming an insulating layer.

Advantageously, the thickness of oxide formed is greater than or equal to the width of the sacrificial protective layer. Preferably, the oxidised thickness is between 1 and 5 nm. Preferably the oxidation is isotropic, the oxidised width of the gate flanks being equal to the oxidised depth of the active layer.

The gate stack preferably comprises the following layers stacked from the active layer: an insulating layer (for example a high-k layer), a metal layer, the gate and the hard mask covering the top surface of the gate.

According to one embodiment, the step of forming the protective spacers is performed after the etching of the channel. According to another embodiment, the step of forming the protective spacers is performed before the etching of the channel.

Preferably, the initial insulating layer is a buried oxide layer in a stack of layers of the SOI type.

Advantageously, the active layer is a layer of semiconductor material based on silicon or germanium. It may for example be made from silicon, germanium or silicon-germanium.

According to an advantageous embodiment, the active layer is a layer of monocrystalline semiconductor material, such as monocrystalline silicon.

According to one embodiment with regard to the cavities, the top face of the insulating film is situated below the bottom face of the active layer forming the channel. This in particular makes it possible to reduce the access resistance to the S/Ds without increasing the parasitic capacitance between S/D and gate.

According to one embodiment with regard to the cavities, the top face of the insulating film is situated below the bottom face of the initial insulating layer in the SOI stack.

Another subject matter of the present invention concerns a transistor comprising a stack of layers comprising at least and preferably only: an active layer forming a channel for the transistor, an insulating layer disposed opposite a bottom face of the channel and on a top face of a substrate, a gate stack turned opposite a top face of the channel and a source and drain disposed on either side of the gate stack and extending at least partially, preferably mainly and even more preferentially entirely, under the top face of the channel and/or under the gate stack. The source and drain are disposed in cavities situated on either side of the gate stack. The insulating layer forms an uninterrupted layer between the two cavities of the transistor. The insulating layer has a bottom face where the distance with respect to a bottom face of the substrate is greater under the gate stack than in the cavities.

The distance is taken in a direction perpendicular to the bottom face of the substrate and from this face.

Thus the insulating layer forms a step under the gate stack. Under the gate stack, the substrate rises beyond the height of the bottom face of the re-formed insulating layer taken in a cavity. Thus, only under the gate stack, the substrate forms a projecting relief, the faces of which are in contact with the insulating layer. Thus the bottom face of the insulating layer and the top face of the substrate are not flat.

The gate stack comprises a control gate and the source and drain regions extend at least partly and preferably completely under the control gate. Thus they are buried under the control gate. Advantageously, they extend over at least 50% and preferably over at least 70% of the height thereof under the control gate. Preferably, they extend over at least 90% of the height thereof under the control gate. According to a non-limitative embodiment, the source and drain each have a portion opposite the gate in a direction parallel to the plane of the substrate, the height of said portion in a direction perpendicular to the plane of the substrate is less than 0.3 times the height of the gate. Preferably, this height is less than 0.1 times the height of the gate.

In the context of the present invention, the term "on", "surmounts" or "underlying" does not necessarily mean "in contact with". Thus, for example, the deposition of a first layer on a second layer does not necessarily mean that the two layers are directly in contact with each other but means that the first layer at least partially covers the second layer while being either directly in contact with it or being separated from it by another layer or another element.

Figure 3:
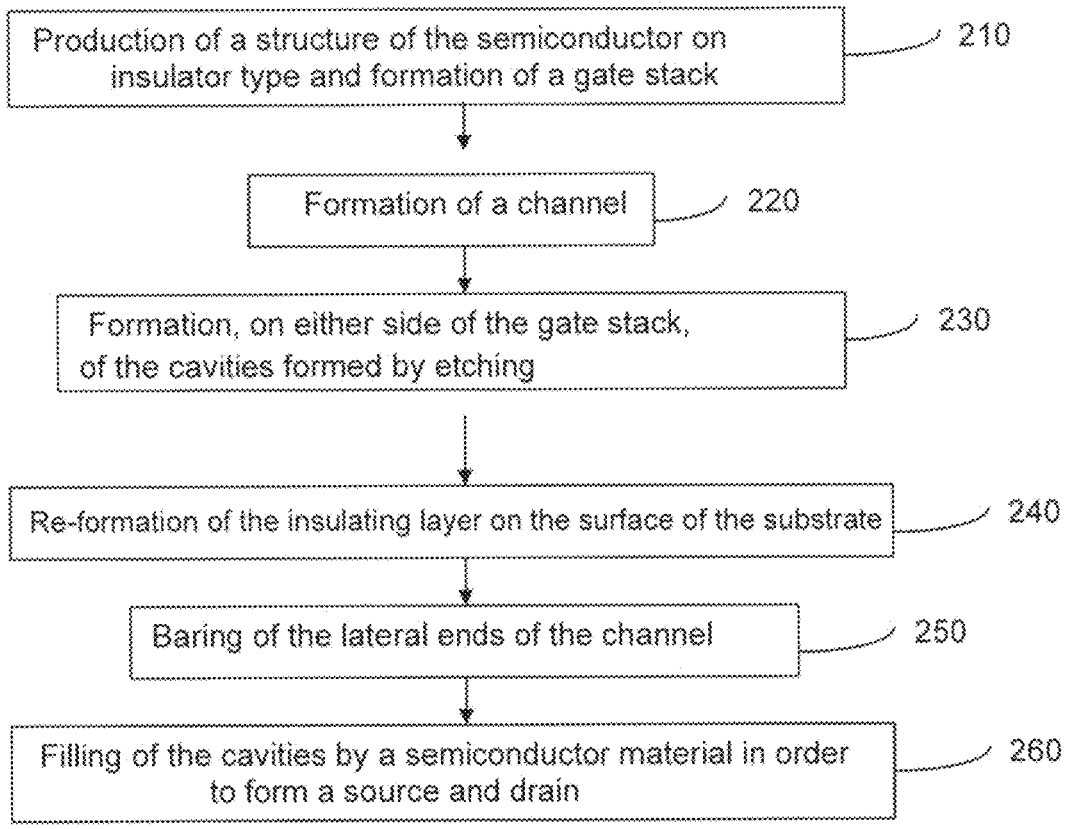
FIG. 3 summarises the main steps of manufacturing a transistor according to the method of the invention.

FIG. 3 summarises the main steps of manufacturing a transistor according to one embodiment of the invention.

The starting structure of the method according to the invention is a structure of the semiconductor on insulator type, for example of the SOI (silicon on insulator) type, on which a control gate of the transistor is formed. This step is referenced 210 in FIG. 3. One or more steps (220, 230) consist of forming, on either side of the gate 124, cavities 440 through the active layer 146, the insulating layer of the structure SOI, also referred to as the initial insulating layer 114, or even in a portion of the substrate 112. Advantageously, these cavities 440 are obtained by one or more selective etchings of the gate stack 160. The surfaces of the cavities 440 are then made insulating in order to form a continuous insulating layer 118. The layer 118 is uninterrupted (step 240). It is clear in FIGS. 4a to 11h that it is uninterrupted between the two transistors depicted in these figures. Lateral ends of the channel are then bared (step 250). The source and drain 140 are then produced by filling the cavities 440 with a semiconductor material (step 260). Advantageously, the cavities 440 are filled by epitaxy from the bared lateral ends 117 of the channel 180.

These steps are described with more details with reference to the various embodiments illustrated in FIGS. 4 to 11.

FIGS. 4a to 4e describe steps of a first embodiment according to the method of the invention.

Figure 4A:
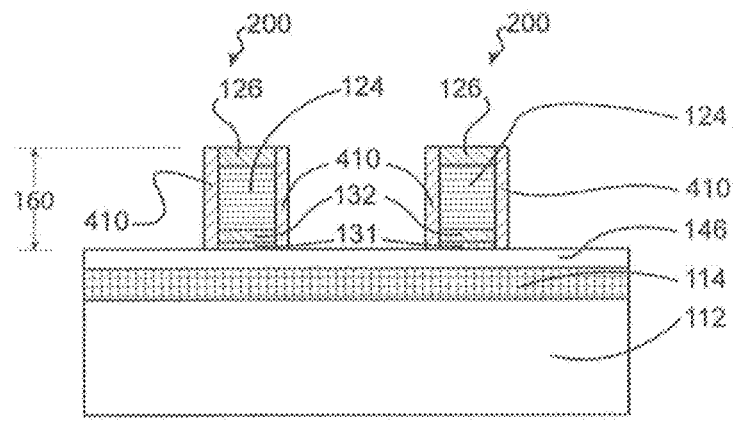
FIGS. 4a to 4e describe specific steps of the transistor manufacturing method according to a first embodiment of the invention, FIG. 4e illustrating an example of a transistor according to the invention once finalised.

FIG. 4a illustrates a structure 200 of the SOI type, the active layer 146 of which is surmounted by two gates 124. Only two gates 124 are illustrated in this figure in order to facilitate understanding of the invention. This figure is obtained at the end of step 210 in FIG. 3. This step 210 consists of producing, from a substrate 112, often referred to as a bulk substrate, an initial insulating layer 114 and an active layer 146 intended subsequently to form the channel 180 of each transistor 200. Next, during this step 210, a stack 160 comprising following layers stacked from the active layer 146 is produced: an insulation layer of the gate, often referred to as a thin gate oxide 131 or high-k layer, a metal layer 132, a gate 124 and a hard mask 126 covering the top surface of the gate 124. Furthermore, the substrate 112 is preferentially a doped substrate where the doping level is high, in order to be able to preferentially oxidise the substrate 112 in a subsequent step.

In the remainder of the description, gate stack means the stack 160 of layers comprising at least the gate 124 and the insulation layer 131. The stack 160 may also comprise, optionally, the layer 132, the layer 126 and/or an electrical contact layer on the top of the gate 124, often formed by siliciding the gate 124 and intended to provide good electrical contact between the gate 124 and the other elements of the device.

Advantageously, this embodiment also provides for the production of protective layers, also referred to as spacers 410, situated on either side of the gate stack 160. These spacers 410 cover the flanks of the stack 160. They are advantageously made from silicon nitride. The hard mask 126 and the spacers 410 protect the stack 160 so that the flanks of the stack 160 are not etched during the following operations. As will appear in the remainder of the description, the hard mask 126 and the spacers 410 are made from a material resisting the cavity etching products, for example from silicon nitride.

Figure 4B:
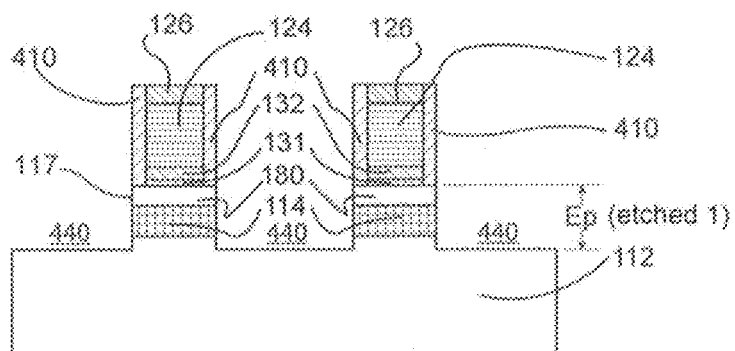

FIG. 4b illustrates the structure obtained at the end of step 220 and step 230. According to the first embodiment, the formation of the channel 180 (step 220) and the formation of the cavities 440 (step 230) on either side of the gate stack 160 can be produced by a single anisotropic etching selective with respect to the hard mask 126 of the gate 124. The favoured etching direction of this anisotropic etching is a direction perpendicular to the plane of the substrate 112. This etching is preferably perfectly anisotropic directed vertically.

At this stage, as mentioned previously, the presence of the hard mask 126 and the spacers 410 serves as protection for the gate stack 160. The etching therefore removes the portions of active layer 146 and initial insulating layer 114 that are not situated below the gate 124. The cavities 440 are formed by an etching that preferentially attacks the horizontal surfaces of the active layer 146, of the initial insulating layer 114 and preferably of a top part of the substrate 112, that is to say those that are parallel to the plane of the substrate 112, the etching leaving in place only the perpendicular surfaces covering the flanks of the patterns of the gate stack 160. The channel 180 is thus defined.

The etching or etchings are performed so as to attack the entire surface of the active layer 146 not protected by the gate stack 160 and the entire surface of the initial insulating layer 114 not protected by the gate stack 160.

Particularly advantageously, the cavities 440 thus formed by etching are automatically aligned with respect to the gate stack 160.

The etching or etchings remove the entire active layer 146 and the initial insulating layer 114 not protected by the gate stack 160. Preferably, the etching also removes a portion of the bulk substrate 112.

The etching depth is to be chosen according to the dimension of a required source and drain 140 and the thickness of the insulating layer. Provision can be made for stopping the etching when the entire thickness of the insulating layer 114 is removed. Provision can also be made for etching the substrate as shown in FIG. 4b. This depends essentially on the thickness of the S/Ds that is required. Preferably, the etched depth in the substrate 112 is between 5 and 50 nm.

It will also be ensured that the depth is not too great in order to avoid the formation of voids between the substrate 112 and the source and drain regions 140 to be formed. This aspect will be made clear in the remainder of the description.

It should be noted here that the channel 180 and the cavities 440 can be obtained by repeating the etching step 230 until a preferred depth of the cavities 440 is obtained. In addition, in other embodiments, step 220 and step 230 may be performed separately. It is thus possible to effect a first etching in order to remove the active layer 146 and then to effect one or more other etchings in order to remove the initial insulating layer 114 and optionally a portion of the substrate 112.

Figure 4C:
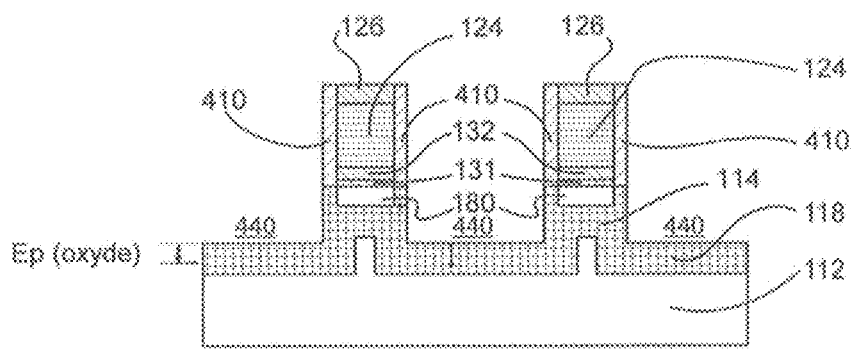

FIG. 4c shows the structure obtained at the end of the step 240 of forming or re-forming an insulating layer on the surface of the substrate 112. The insulating layer 118 comprises the portions of the initial insulating layer 114 that are not etched (these portions being situated under the gate stack 160 and under the channel 180 and are therefore protected during etching) and the regions of the substrate 112 where the surface was made insulating.

This step of forming the insulating layer 118 is preferably performed by oxidising the surface of the substrate 112 bared by the formation of the cavities.

The oxidation of the substrate 112 forms an insulating film on the surfaces of the substrate 112 bared by the etching. This insulating film is in contact with the portion of the layer 114 that is situated under the gate stack 160 and which did not therefore disappear during etching. The insulating film and the remaining portions of the layer 114 define a re-formed insulating layer 118 uninterrupted from one cavity 440 to the other of the transistor 200. It may for example extend over the entire wafer or between isolation trenches of the STI type.

The oxidation of the surface of the substrate 112 to form the insulating film also leads, in this non-limitative embodiment, to oxidising the portions of the channel 180 that are not protected. This is because the channel 180 is not protected by the spacers 410 or by protective layers, as is the case for example with the third embodiment described below. Advantageously, the oxidation is performed so that the width of the layer of oxide formed on the ends of the channel 180 is at most equal to the width of the spacers 410. For example, the spacers have a width of 10 nm. In addition, the oxidation is performed so that the thickness of the oxidised layer formed on the surface of the substrate 112 is at least twice as great as the width of the layer of oxide formed on the ends of the channel 180. For the gate length of the technological node in question, such as a length of 14 nm or 20 nm, the formation of an oxide as thin as 1 nm at the channel is achievable.

In the context of the present invention, width means a dimension taken in a direction parallel to the plane of the bottom face of the substrate 112. Thickness means a dimension taken in a direction perpendicular to the plane of the bottom face of the substrate. Thus, in the figures illustrated, the widths of the layer of oxide on the ends of the channel 180 and the width of the spacers 410 are taken in a horizontal direction and the thicknesses are taken in a vertical direction.

Figure 4D:
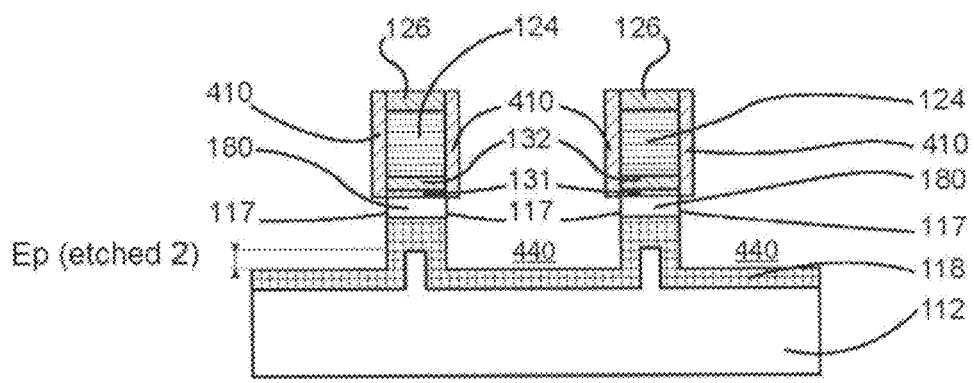

Lateral ends of the channel 180 means the ends 117 that appear in the plane of the figures. These ends are indicated in FIGS. 4b and 4d under the reference 117.

Thus, advantageously, the oxidation is therefore done in a favoured manner on the substrate 112 rather than on the channel 180.

Preferentially, in order to obtain faster oxidation kinetics on the substrate 112 than at the channel 180, a doping level for the substrate 112 different from the doping level of the channel 180 is provided.

Advantageously, an n-type doping with arsenic (As) is provided with a doping level of $10^{20}/cm^3$. More generally, a high doping level is favoured, even close to the limit of solubility of the material forming the substrate 112.

In more general terms, the substrate 112 and preferably its surface only, may be doped with a species taken from As, B or P. The doping level of the substrate 112 is between $1^E 19$ and a few $1^E 20$ atoms per $cm^3$. More advantageously, it is greater than $1^E 20$ atoms per $cm^3$.

According to one embodiment, the channel 180 may not be doped during oxidation. According to one embodiment, the doping level of the substrate 112 is around $1^E 16$ atoms per $cm^3$.

By way of example, the substrate 112 is N-doped and the channel 180 is non-doped. Advantageously, the oxidation is a vapour-phase oxidation at low temperature, typically a temperature of between 700° and 800° C. These conditions make it possible to have oxidation kinetics significantly different between substrate 112 and channel 180.

This differentiation is done very well for small oxide thicknesses (linear oxidation regime). The oxide thickness formed is less than 100 nm.

This oxidation step thus forms an insulating film on all the bared surfaces of the substrate 112 and of the active layer 146.

Preferably, this oxidation is carried out on the full wafer. No prior lithography is necessary to define specific regions to be oxidised, which makes the method more precise and reliable.

FIG. 4d shows the structure obtained at the end of the step 250 of baring the lateral ends 117 of the channel 180.

In this embodiment illustrated in FIG. 4, the re-formation of an insulating layer 118 leads to covering the lateral ends 117 of the channel 180 with oxide. Step 250 is then performed to bare the lateral ends 117 of the channel 180. The channel 180 will then be ready to serve as an epitaxial growth source during the step 260 of filling the cavities 440, as will be described with reference to FIG. 4e.

In order to remove the layer of oxide formed on the channel 180, isotropic etching is preferably carried out. This etching is performed so as to:

completely remove the oxide at the channel 180 in order to bare the lateral ends 117 of the channel 180;
partially remove the oxide at the substrate 112.

This is why it is important for the oxidised width at the lateral ends 117 of the channel 180 to be less than the oxidised thickness on the surface of the substrate 112. There therefore remains a layer of oxide on the surface of the substrate 112. This layer of oxide forms, with the initial insulating layer 114, a continuous or uninterrupted insulating layer 118 from one cavity 440 to another on the same transistor 200. In particular, the oxide is always present on the surface of the substrate 112, that is to say on its flat walls and also on its vertical walls if the cavities 440 extend in the substrate 112.

The etching is for example an etching with hydrofluoric acid. The etching is stopped as soon as the oxide on the flanks of the channel 180 has been consumed. The duration of etching is determined by the thickness of oxide formed previously at the channel 180 and by the etching kinetics.

In order to determine the moment at which the etching must be stopped, it is also ensured that sufficient oxide is preserved at the isolation trenches when they are present (not shown in the figures).

Figure 4E:
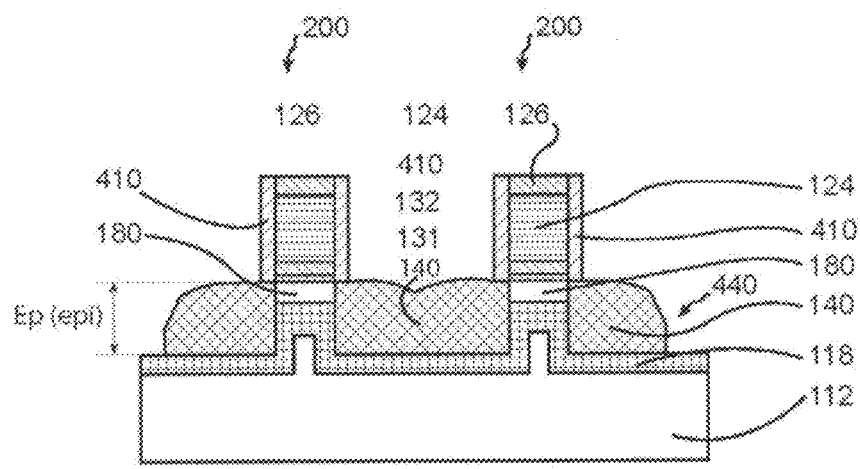

FIG. 4e shows the structure obtained at the end of the step 260 of formation of the source and drain 140. This step consists essentially of filling the cavities 440 with a semiconductor material, for example silicon, in order to form source and drain regions 140 for each transistor 200.

Advantageously, the cavities 440 are filled by epitaxy initiated by the semiconductor material of the channel 180. Preferably, the channel 180 is a monocrystalline semiconductor material and the source and drain regions 140 are also monocrystalline.

Identical materials are then provided to form the channel 180 and to fill the cavities 440. It is possible for example to use silicon or other semiconductor materials also capable of being used in a monocrystalline form, such as germanium (Ge) or alloys of these two materials (Si—Ge). It is also possible to provide materials that are different but existing in a crystalline form suited to the crystalline lattice of the channel 180, that is to say it has, for example, mesh parameters that differ by less than 1% and preferably by less than 0.5% from that of the material of the channel 180 in the plane parallel to the face of the substrate 112.

These features relating to the step 260 of filling the cavities 440 are valid for all the following embodiments that involve epitaxy for filling the cavities 440.

It should be noted that the epitaxy is done downwards in order to fill the cavities 440 and to avoid the source and drain regions coming opposite the gate 124.

Particularly advantageously, the presence of the spacers 410 tends to prevent the epitaxy from rising in the direction of the gate 124. The spacers 410 in fact form a return above the lateral ends 117 of the channel 180, this return blocking an upward rising of the epitaxy. The spacers 410 thus promote the epitaxial growth downwards.

Using faceted epitaxy (i.e. for which HCl is a vector gas and for which the deposition of material and etching cycle is alternated), it is possible to favour the epitaxial growth of silicon along the oxide interfaces compared with the nitride interfaces and thus favour growth downwards to the detriment of that along the nitride spacers. According to the degree of opening and the required epitaxy thickness, a person skilled in the art will act on the ratio between HCl and silicon vector gas (i.e. DCS—dichlorosilane or silane) and on the ratio between the number of deposition cycles, i.e. where the silicon vector gas is present and the etching ones, i.e. without silicon vector gas.

Because of the preferential wetting of the epitaxy on the oxide of the re-formed insulating layer 118 rather than on the nitride of the spacers 410, cyclic epitaxy with DCS (dichlorosilane) can be envisaged with the formation of facets on the nitride of the spacers 410, which remains advantageous in the problem of reduction of parasitic capacitances with the gate 124.

Moreover, the join between two epitaxy fronts is favoured in the case of devices with a small pitch of for example 100 nm or less. If the transistors 200 are close to one another with a distance that separates them typically by twice the thickness of the silicon that will be grown, the epitaxies that start from a device situated on the left and a device situated on the right will join. If the devices are too far away from each other, the epitaxies will not join, contrary to what is depicted. The fact that the epitaxies join makes it possible subsequently to land a contact on a larger surface.

The depth of the etching of the cavities 440 performed at step 230 is suited to the required thickness of the source and drain 140 according to the electrical specifications. A large thickness of epitaxy is favourable for limiting access resistances to the transistor 200. On the other hand, this thickness must be sufficiently limited not to be in a situation where the source and drain 140 are opposite the gate stack 160, which would increase the parasitic capacitance.

The depth of the cavities 440 is also chosen so as to avoid forming a void under the epitaxy. Advantageously, the maximum depth is between 10 and 50 nm and preferably between 10 and 30 nm. This etching determines the thickness of the source and drain 140 and therefore their resistance, which is an electrical specification.

These features relating to the etching depth are valid for all the following embodiments that involve epitaxy for filling the cavities 440.

Additionally it is possible to effect a doping of the source and drain regions 140. This doping is for example effected in situ. These features relating to doping are valid for all the following embodiments that involve epitaxy for filling the cavities 440.

Thus the invention provides a transistor in which the insulating layer 118 has a bottom face where the distance d1 with respect to a bottom face of the substrate 112 taken under the gate stack is greater than the distance d2 between the bottom face of the insulating layer 118 and the bottom face of the substrate 112 taken at a cavity 440. These distances d1 and d2 are illustrated in FIG. 4d. Preferably, the difference between d1 and d2 is greater than 10 nm.

The insulating layer 118 forms a step under the gate stack 160. Under the gate stack 160, the substrate 112 rises beyond the height of the bottom face of the re-formed insulating layer 118 taken in a cavity 440. Thus, only under the gate stack, the substrate comprises a projecting relief 119, the faces of which are in contact with the insulating layer 118. Thus the bottom face of the insulating layer 118 and the top face of the substrate are not flat.

Advantageously, the source and drain 140 extend over at least 70% preferably of their height under the control gate. Preferably, they extend over at least 90% of their height under the control gate. According to a non-limitative embodiment, the source and drain each have a portion opposite the gate in a direction parallel to the plane of the substrate, the height of said portion in a direction perpendicular to the plane of the substrate is less than 0.3 times the height of the gate. This height is preferably less than 0.1 times the height of the gate.

FIGS. 5a to 5h describe steps of a second embodiment according to the method of the invention. FIG. 6 summarises the steps of manufacturing a transistor 300 according to the second embodiment of the invention. FIGS. 5a, 5b, 5d, 5e, 5f, 5g and 5h, corresponding respectively to steps 210, 220, 230, 240, 250, 230 and 260 in FIG. 3, have already been described in the description of the first embodiment.

In general terms, in this embodiment, sacrificial spacers 412 are provided to prevent oxidation of the channel 180 during the oxidation step serving to form a continuous insulating layer 118. Moreover, other spacers 410 are provided directly in contact with the gate 124 in order to protect the latter during the epitaxy. These steps are presented in more detail hereinafter.

Figure 5A:
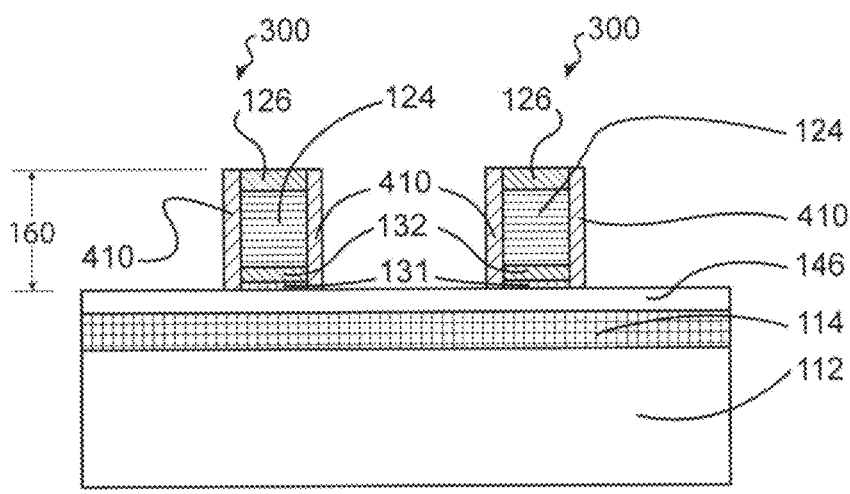
FIGS. 5a to 5h describe specific steps of the transistor manufacturing method according to a second embodiment of the invention, FIG. 5h illustrating an example of a transistor according to the invention once finalised.
Figure 6:
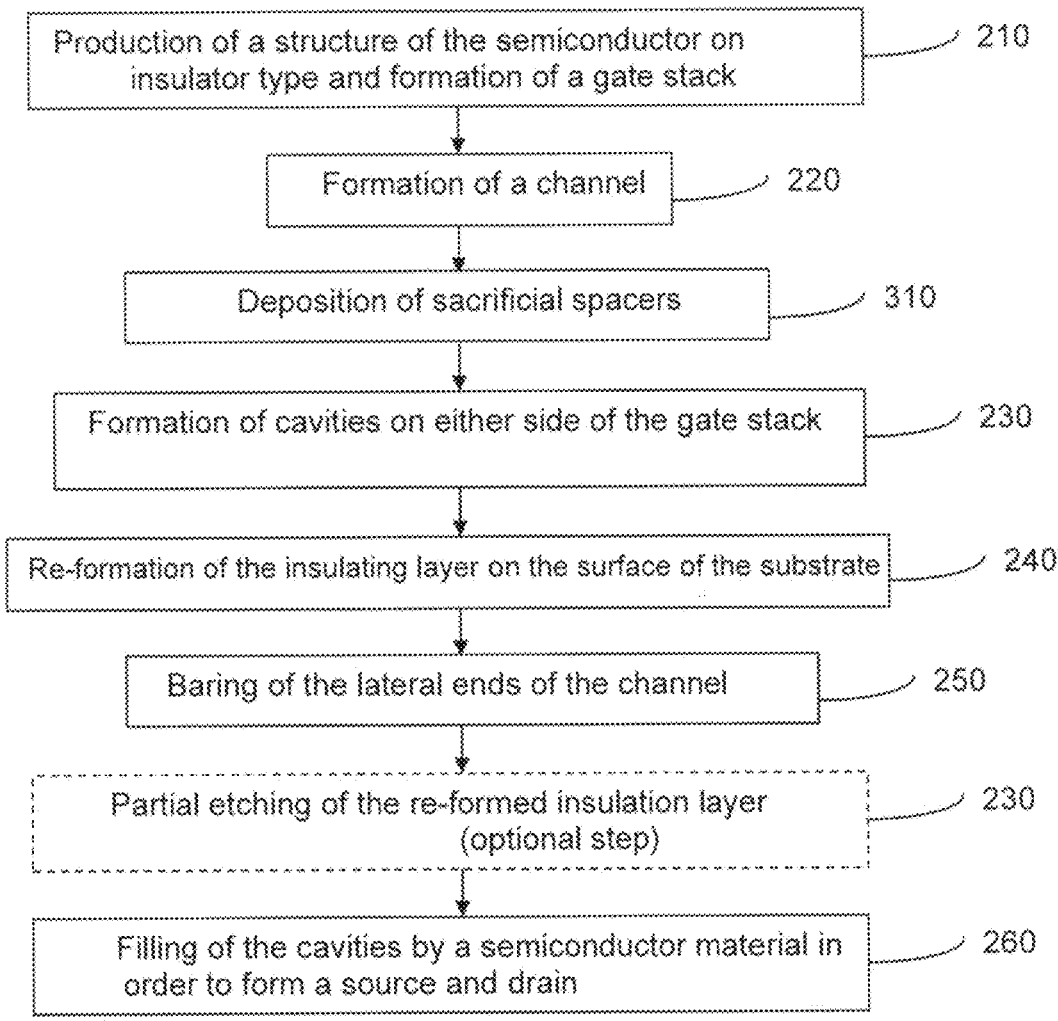
FIG. 6 summarises the steps of manufacturing transistors according to the second embodiment of the invention.

FIG. 5a shows the semiconductor on insulator structure 300 supporting gate stacks 160 at the end of step 210. According to this embodiment, the substrate 112 may be a doped or non-doped substrate. As in the first embodiment, a deposition of spacers 410 is effected in order to protect the flanks of the gate stack 160. These spacers 410 are for example produced from nitride.

Figure 5B:
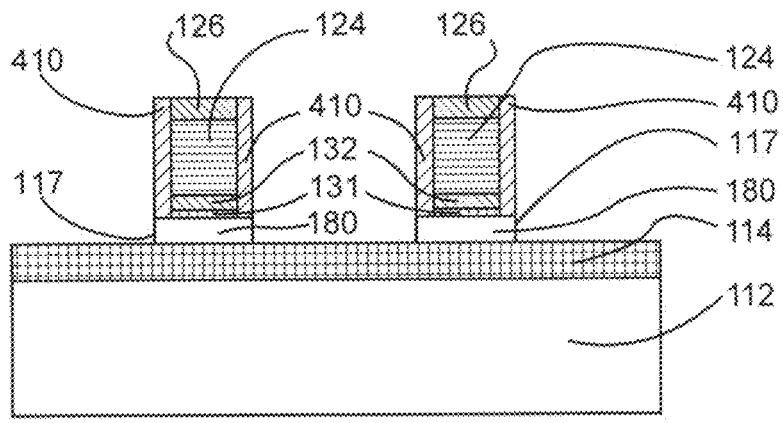

FIG. 5b shows the structure obtained at the end of step 220. An anisotropic etching (preferably perfectly anisotropic), the favoured direction of which is perpendicular to the plane of the substrate 112, for example a reactive-ion etching, is performed in order to eliminate the parts of the active layer 146 with the exception of the regions situated below the gate stack 160. These parts of the active layer 146 protected by the hard mask 126 form the channels 180 of the transistors 300. The etching is stopped when the non-protected active layer 146 is consumed and preferably before etching of the initial insulating layer 114 of the SOI structure.

Figure 5C:
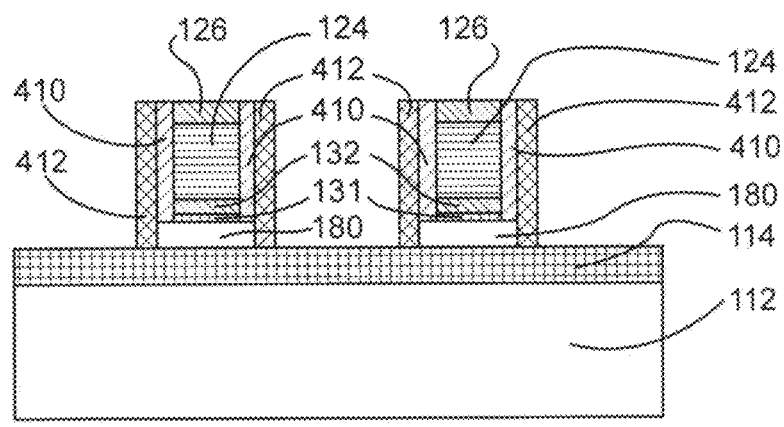

FIG. 5c shows the structure obtained at the end of step 310 of deposition of protective layers forming sacrificial spacers 412 for the gate stack 160 and for the channel 180. The sacrificial spacers 412 cover the flanks of the spacers 410 and of the channel 180. The material of the sacrificial spacers 412 is for example an oxide. The role of this protective layer is essentially the protection of the lateral ends 117 of the channel 180 during the etching and oxidation that will follow.

Figure 5D:
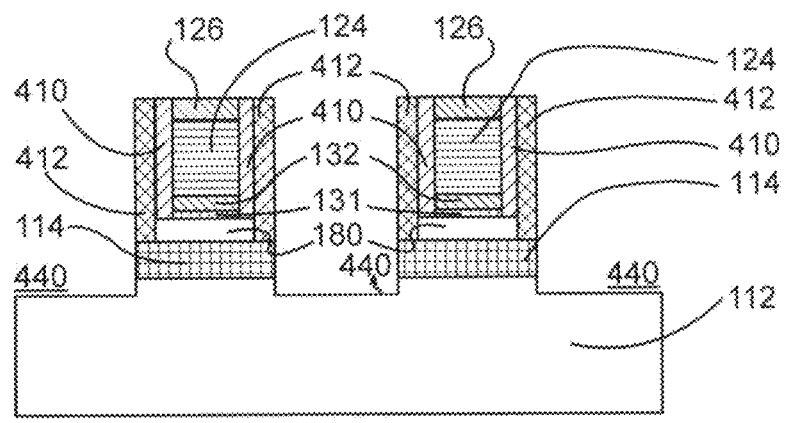

FIG. 5d shows the structure obtained at the end of step 230. At this stage, as mentioned previously, the presence of the hard mask 126, of the spacers 410 and of the sacrificial spacers 412 serves as protection for the gate stack 160 and the channel 180. The cavities 440 are formed by an anisotropic etching that preferentially attacks the surfaces parallel to the plane of the substrate 112 (horizontal surfaces) of the initial insulating layer 114. The etching is preferably perfectly anisotropic and its favoured direction is perpendicular to the plane of the substrate 112. The materials of the hard mask 126, of the spacers 410 and of the sacrificial spacers 412 are chosen so as to resist the etching. Thus the entire initial insulating layer 114 not protected by the gate stack 160 is eliminated. Only the initial insulating layer 114 disposed under the channel 180 remains. Preferably, a top part of the substrate 112 is also etched. The etching depth, for example 5 to 50 nm in the substrate 112, is to be chosen according to the dimension of the source and drain 140 formed subsequently.

Figure 5E:
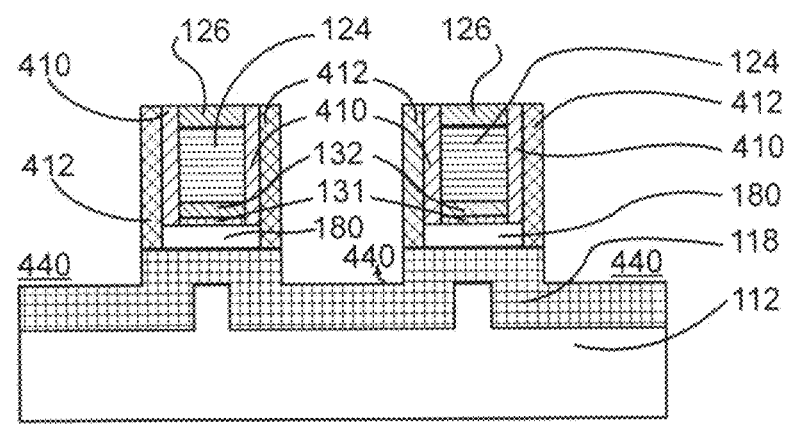

FIG. 5e shows the structure obtained at the end of step 240 of re-formation of an insulating layer 118 on the surface of the substrate 112. This step is performed by an oxidation of the substrate 112 in order to form an insulating film on the uncovered surfaces of the substrate 112. The channel 180 is protected by the sacrificial spacers 412 and is therefore not oxidised. The thickness of oxide at the substrate 112 is preferentially greater than the width of the sacrificial spacers 412.

Thus, as with the previous embodiment, the formation of a second insulating layer comprises the formation by oxidation of an insulating film on all the bared surfaces of the substrate 112 and on all the bared surfaces of the active layer 146 situated below the gate stack. In this embodiment, the active layer 146 situated below the gate stack does not have a bare surface since the ends of the channel 180 are protected by the spacers. Thus only the surfaces of the substrate 112 bared by the etching are oxidised.

According to an advantageous embodiment, the oxidation of the substrate 112 is a dry oxidation at a temperature of between 700° and 900° C. and preferably 800° C.

Figure 5F:
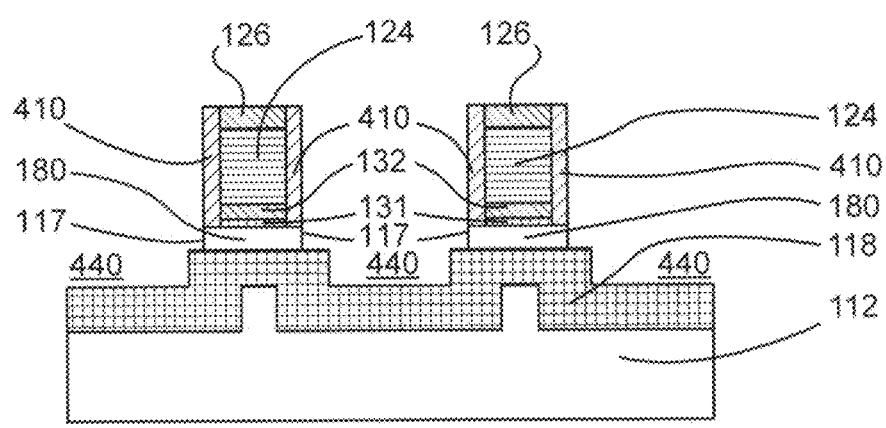

FIG. 5f shows the structure obtained at the end of the step 250 of baring the lateral ends 117 of the channel 180. This clearing of the lateral ends 117 of the channel 180 is performed by removing the sacrificial spacers 412. The sacrificial spacers 412 are eliminated by a step of selective etching with respect to the spacers 410. It is therefore necessary for the etching solution to attack the material of the sacrificial spacers 412 without attacking the spacers 410. It will be possible to provide for example a nitride material for the sacrificial spacers 412 and an oxide for the spacers 410 and an orthophosphoric acid etching for the etching solution.

Figure 5G:
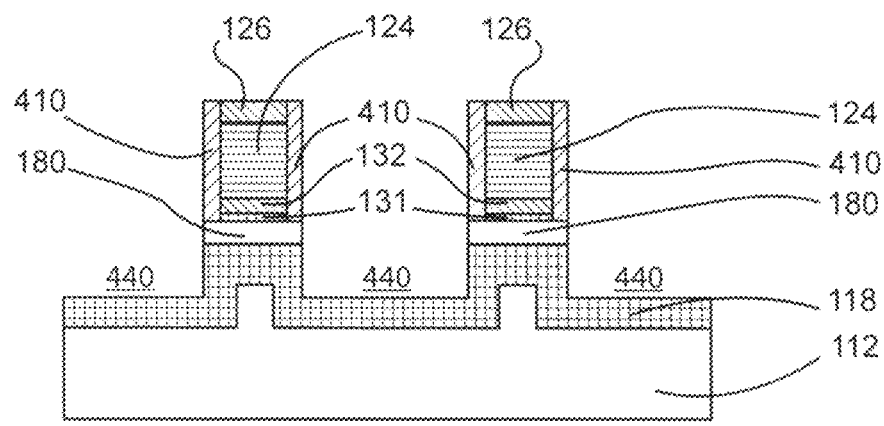

FIG. 5g shows the structure obtained at the end of step 230. This advantageous step is merely optional. In order to have a thicker source and drain 140, a step of etching only part of the insulating layer 118 is performed. This isotropic etching attacks the bared insulating layer 118, that is to say the insulating layer 118 not situated below the gate stack 160 and the spacers 410. The etched thickness is preferably of a dimension at least equal to that of sacrificial spacers 412. Preferentially, the etched thickness is identical to the width of the sacrificial spacers 412 so that the vertical walls of the re-formed insulating layer 118 fit flush with the flanks of the channel 180 and the flanks of the spacers 410 covering the gate stack 160.

Particularly advantageously, this step of partial etching of the re-formed insulating layer 118 makes it possible to avoid the undesired appearance of a void at the following step 260 of filling the cavities 440. As illustrated in the figures, this etching eliminates a corner formed by the layer of oxide 118 and which defined two levels, one at the bottom face of the active layer 146 and the other in the bottom of the cavities 440.

This etching is selective of the channel 180. It is performed, for example, with hydrofluoric acid. Furthermore, it is preferable to control the etching so as to not limit the consumption of the STI isolation trenches.

Figure 5H:
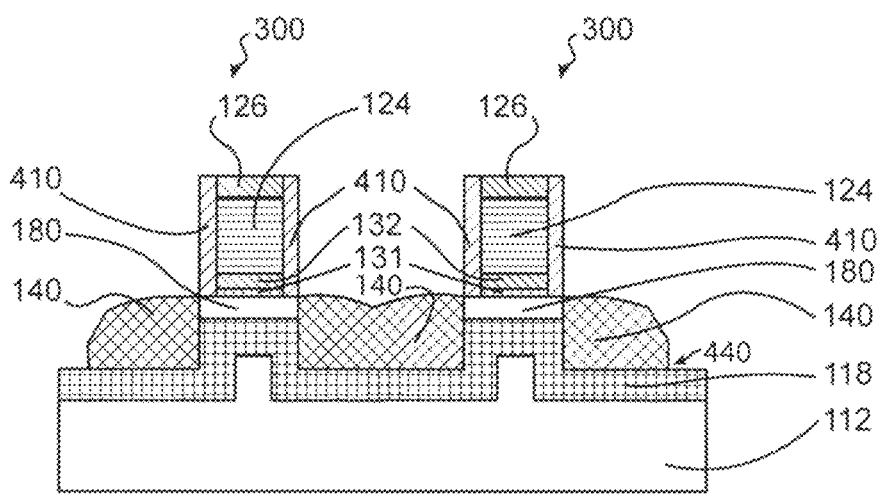

FIG. 5h shows the structure obtained at the end of the step 260 of forming the source and drain 140. The cavities 440 are filled by an epitaxy initiated by the semiconductor material of the channel 180.

Part of the epitaxy may not be directed downwards. Even when part of the S/Ds rises opposite the gate, the total thickness of the S/Ds remains greater than, typically at least 1.5 times greater than or even twice as great as, the thickness of the S/Ds opposite the gate. The invention therefore remains advantageous.

The features indicated in the description of the embodiment illustrated in FIG. 4 with regard to this step 260 of the etching depth and doping of the source and drain regions 140 are valid for this embodiment illustrated in FIG. 5.

The structure obtained with this embodiment makes it possible to obtain a source and drain 140 buried under the gate 124. Advantageously, the source and drain 140 are auto-aligned with the gate 124. Furthermore, it has the advantage of being able to use a doped or non-doped substrate 112. Moreover, the channel 180 is protected during the oxidation used to re-form the re-formed insulating layer 118.

FIGS. 7a to 7i describe steps of a third embodiment according to the method of the invention. FIG. 8 summarises the steps of manufacturing a transistor 400 according to the third embodiment of the invention. FIGS. 7a, 7b, 7d, 7e, 7f, 7g and 7h, corresponding respectively to steps 210, 220, 230, 240, 230, 250 and 260 in FIG. 3, have already been described in the description in the first embodiment. This embodiment is preferentially adapted for thick gate oxides.

In general terms, in this embodiment, sacrificial spacers 412 are provided for preventing oxidation of the channel during the oxidation step used to re-form an uninterrupted insulating layer 118. Moreover, when the cavities 440 are filled by epitaxy, the gate flanks are not protected and growth on the gate flanks 124 is possible. Cycles are then performed comprising an epitaxy followed by a step of etching the semiconductor growing on the flanks of the gate 124 selectively to the semiconductor material growing from the channel 180. It is possible for example to provide for this purpose a monocrystalline material for the channel 180 and a polycrystalline material for the gate 124, the etching chosen being selective for the polycrystalline material with respect to the monocrystalline material.

Figure 7A:
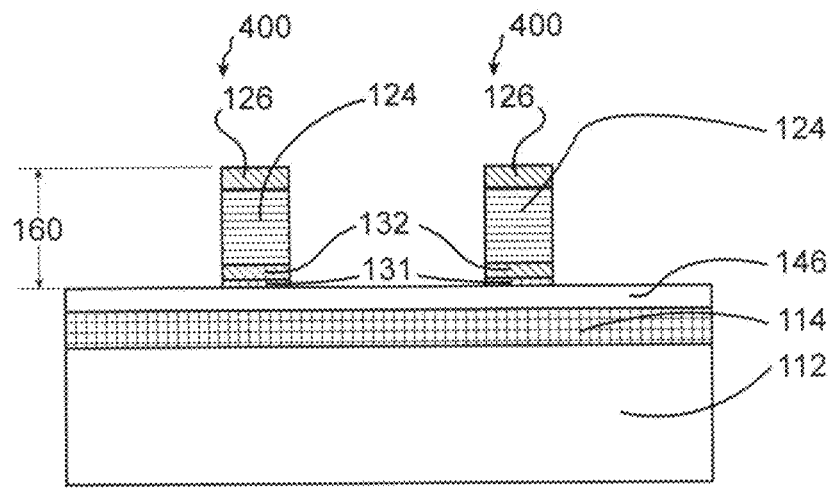
FIGS. 7a to 7i describe specific steps of the transistor manufacturing method according to a third embodiment of the invention, FIG. 7i illustrating an example of a transistor according to the invention once finalised.
Figure 8:
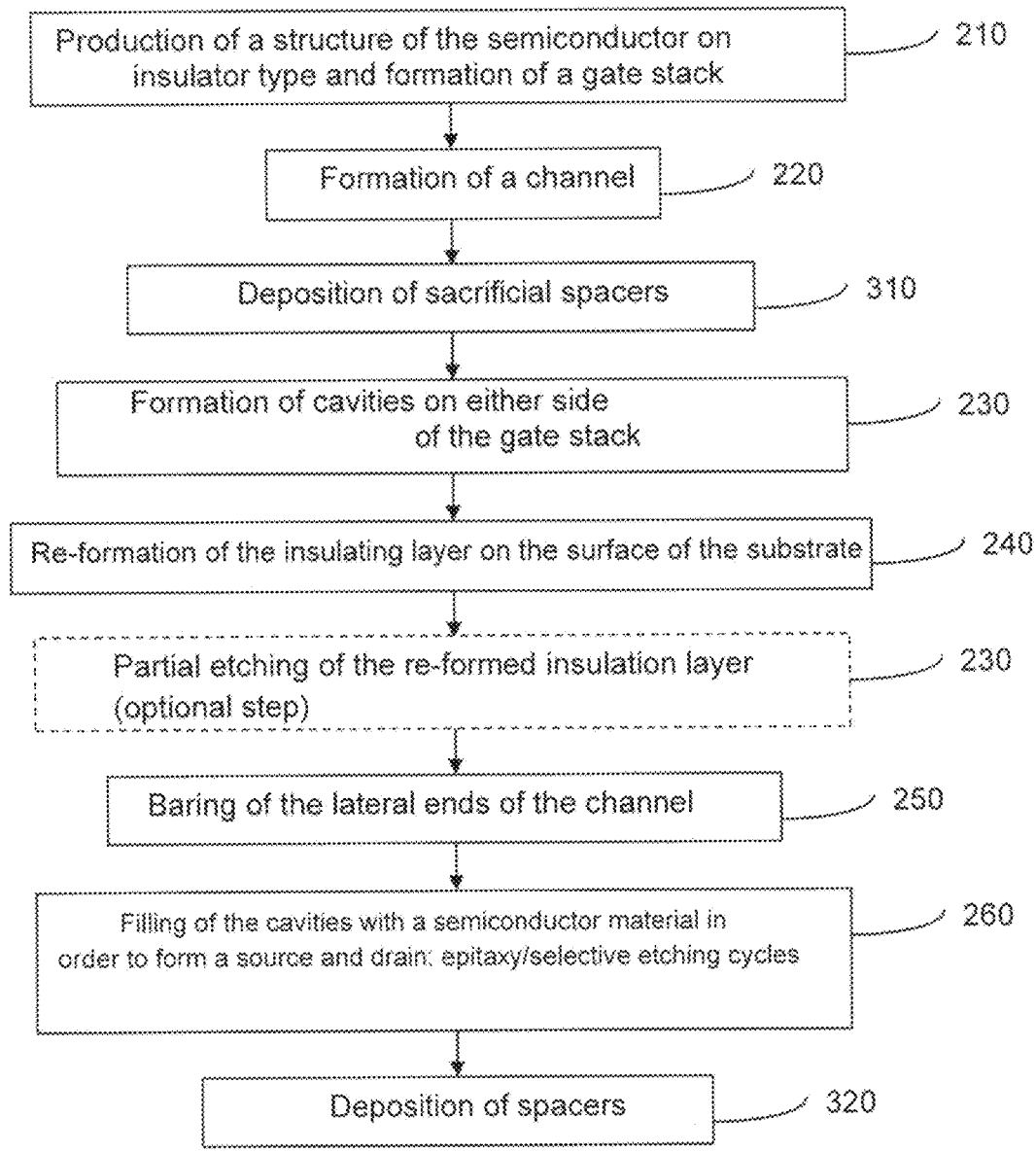
FIG. 8 summarises the steps of manufacturing transistors according to the third embodiment of the invention.

FIG. 7a shows the structure obtained at the end of step 210. According to the third embodiment, the substrate 112 may be a doped or non-doped substrate. At this stage no spacer 410 is produced to cover flanks of the gate stack 160.

Figure 7B:
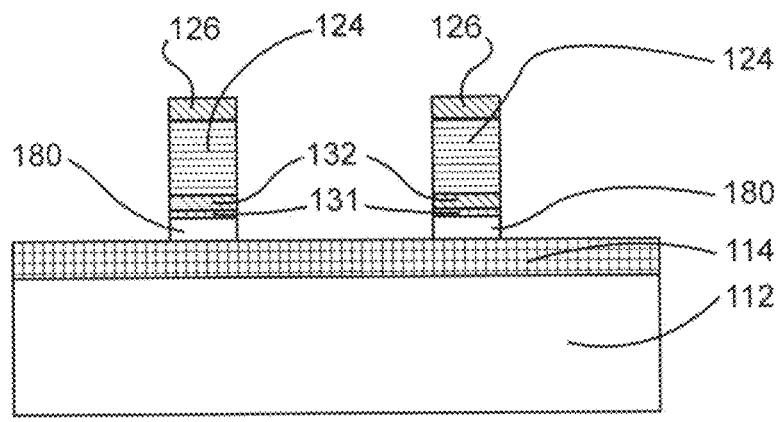

FIG. 7b shows the structure obtained at the end of the step 220 of formation of the channel 180. An RIE etching is performed in order to remove the active layer 146 with the exception of the regions situated below the gate stack 160. The regions of the active layer 146 protected by the hard mask 126 remain in place and form the channels 180 of the transistors 400. The etching is stopped on the initial insulating layer 114.

Figure 7C:
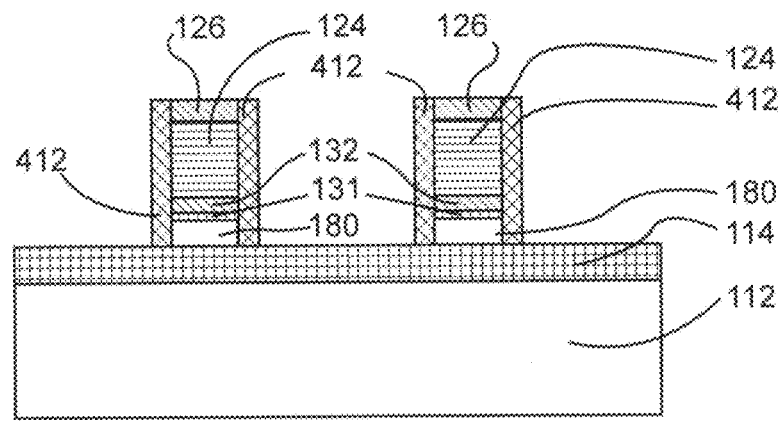

FIG. 7c shows the structure obtained at the end of the step 310 of depositing the sacrificial spacers 412. The sacrificial spacers 412 must cover the bare flanks of the gate stack 160 and of the channel 180 in order to prevent oxidation of the channel 180 during the step of re-forming an insulating layer 118. The material of the sacrificial spacers 412 must be selected so as to be selective to the etching with the hard mask 126 and with the layer of oxide. It is necessary in fact to be able to etch the layer of oxide without etching the sacrificial spacers 412, it must be possible to etch the sacrificial spacers 412 without etching the oxide layer and it is necessary to be able to etch the sacrificial spacers 412 without etching the hard mask 126.

Figure 7D:
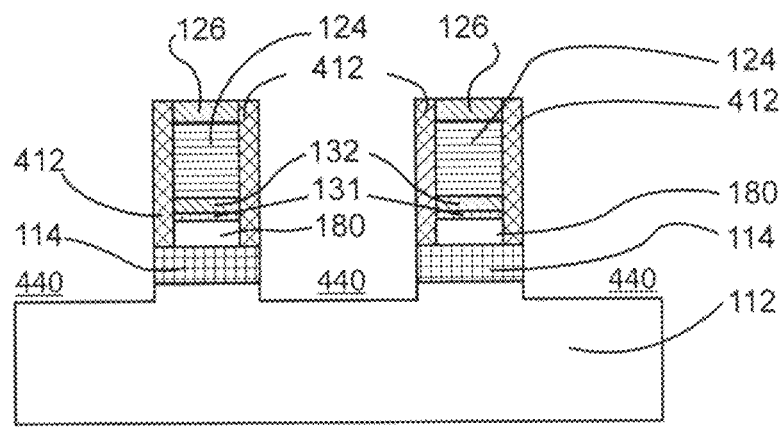
Figure 7E:
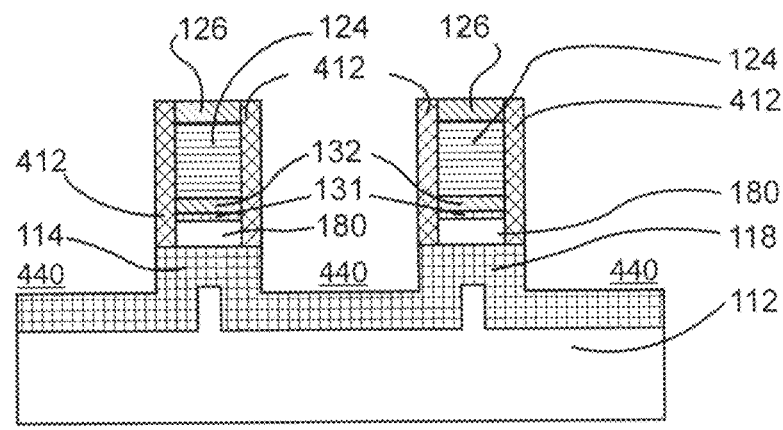

FIGS. 7d and 7e show respectively the gate structures at the end of steps 230 and 240. The descriptions concerning these steps are respectively identical to those concerning the performance of steps 230 and 240 of the second embodiment presented respectively in FIGS. 5d and 5e. At the end of these steps, an insulating film is produced on the uncovered surfaces of the substrate 112 in order to re-form, with the remaining portions of the initial insulating layer 114, an uninterrupted insulating layer 118 on the surface of the substrate 112.

Figure 7F:
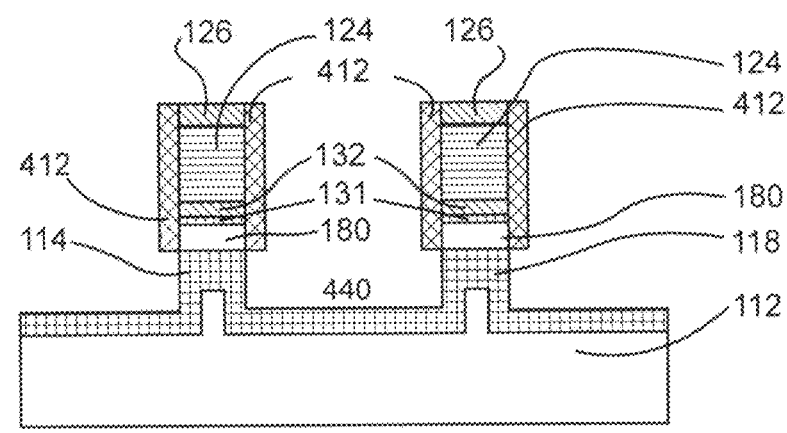

FIG. 7f shows the structure obtained at the end of step 230. In order to have a thicker source and drain 140, a partial step of etching the re-formed insulating layer 118 is performed. This etching is isotropic. The etched thickness is of a dimension at least equal to that of the sacrificial spacers 412.

Thus the layer of oxide situated in line with the sacrificial spacers 412 is taken off. The etching is performed for example with hydrofluoric acid.

Figure 7G:
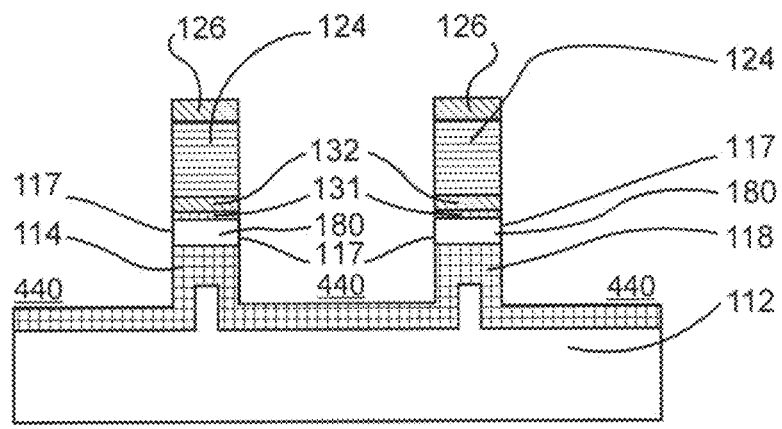

FIG. 7g shows the structure obtained at the end of the step 250 of baring the lateral ends 117 of the channel 180 by removing the sacrificial spacers 412. An RIE etching is performed in order to remove the sacrificial spacers 412 without removing the active layer 146 and at the re-formed insulating layer 118.

Figure 7H:
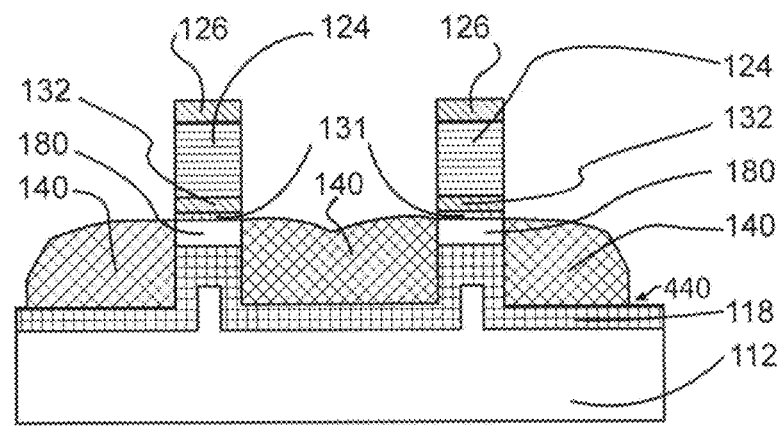

FIG. 7h shows the structure obtained at the end of the step 260 of forming the source and drain 140. The cavities 440 are filled by an epitaxy initiated by the semiconductor material of the channel 180.

It should be noted that, at this stage, the flanks of the gate 124 are uncovered. The semiconductor material of the gate 124 can therefore serve as an initiator for a growth by epitaxy during the epitaxy of the source and drain 140, which is naturally not desired. During this step, at least one selective etching is performed on the regions formed by epitaxy from the flanks of the gate 124 with respect to the regions formed by epitaxy from the channel 180. As briefly indicated below, it is possible for example to provide for a monocrystalline material (monocrystalline silicon for example) to form the channel 180 and a polycrystalline material (polycrystalline silicon for example) for the gate 124. The etching solution is chosen so as to be selective of the polycrystalline material with respect to the monocrystalline material. It is for example a wet chemical etching such as etching with hydrochloric acid (HCl).

Preferably, but optionally, instead of effecting a single epitaxy and a single etching of the semiconductor developed on the flanks of the gate 124, several cycles are performed each comprising a single epitaxy followed by a single step of etching the semiconductor growing on the flanks of the gate 124 selectively to the semiconductor material growing from the channel 180. For example 20 cycles are performed, for etchings of 2 to 3 nm/cycle and for source and drain 140 with a thickness of between 10 and 30 nm.

Reference can be made for example to the following publication "Low temperature Si:C co-flow and hybrid process using $Si_3H_8/Cl_2$" by Bauer and S. G. Thomas, TSF__2011, published in Thin Solid Films 520 (2012) 3133-3138.

This embodiment is particularly well suited to transistors 400 where the oxide 131 of the gate 124 is thick since this tends to move the gate 124 away from the channel 180 and therefore from the source and drain 140, thereby limiting the risks of short-circuits.

It should be noted that, as mentioned previously, the epitaxy is carried out so that it is directed downwards.

The features indicated in the description of the embodiment illustrated in FIG. 4 with regard to this step 260 of filling the cavities 440, the etching depth and the doping of the source and drain regions 140 are valid for this embodiment illustrated in FIG. 7h.

Figure 7I:
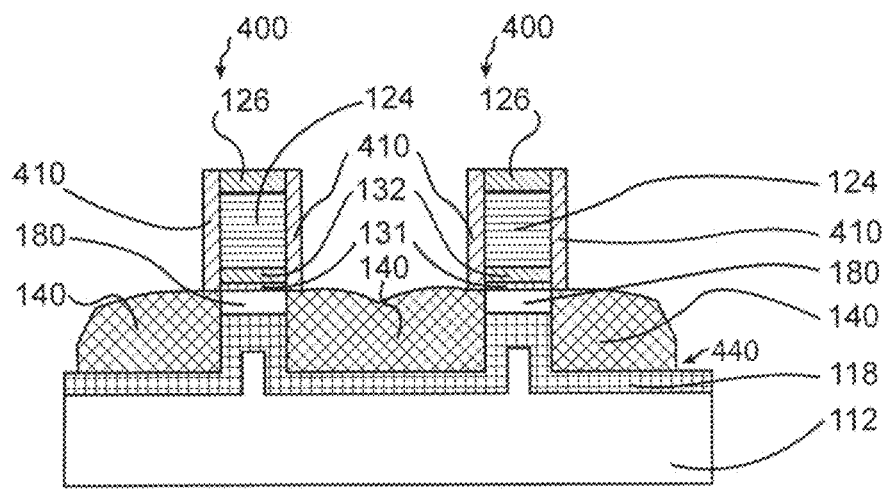

FIG. 7i shows the structure obtained at the end of the step 320 of depositing spacers 410 to cover the flanks of the gate stack 160. This step of encapsulation of the gate 124 is not limitative of the invention.

The structure obtained with this embodiment makes it possible to obtain a source and drain 140 buried under the gate 124. Advantageously, these source and drain 140 are auto-aligned with the gate 124. Furthermore, it has the advantage of being able to use a doped or non-doped substrate 112. Moreover, the channel 180 is protected during the oxidation used to re-form the insulating layer 118.

Next, FIGS. 9a to 9k describe steps of a fourth embodiment according to the method of the invention. FIG. 10 summarises the steps of manufacturing a transistor according to the fourth embodiment of the invention. FIGS. 9a, 9d, 9f, 9g, 9h, 9i and 9j, corresponding respectively to steps 210, 220, 230, 240, 230, 250 and 260 of FIG. 3, have already been described in the description of the first embodiment. This embodiment is preferentially adapted for thick gate oxides.

In general terms, in this embodiment, provision is made, compared with the previous embodiment, for protecting the gate 124 by an oxidisation of its flanks in order to avoid epitaxial growth from the flanks of the gate 124 during the step of re-forming the insulating layer 118 on the surface of the substrate 112.

Figure 9A:
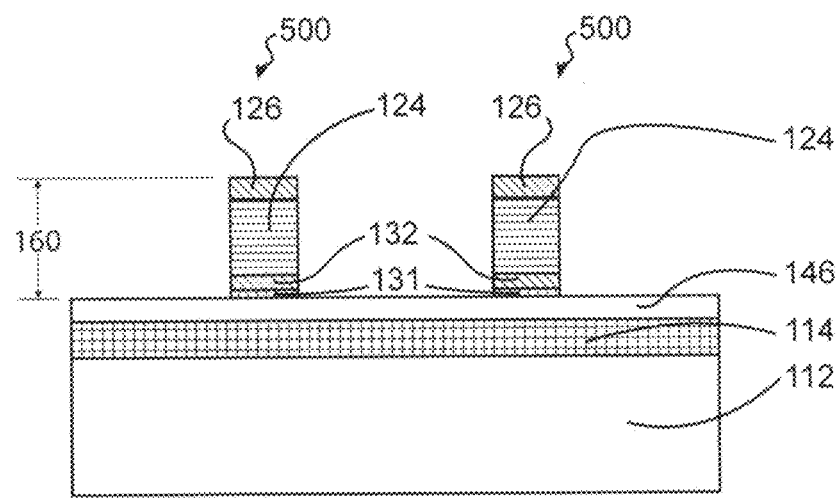
FIGS. 9a to 9k describe specific steps of the transistor manufacturing method according to a fourth embodiment of the invention, FIG. 9k illustrating an example of a transistor according to the invention once finalised.
Figure 10:
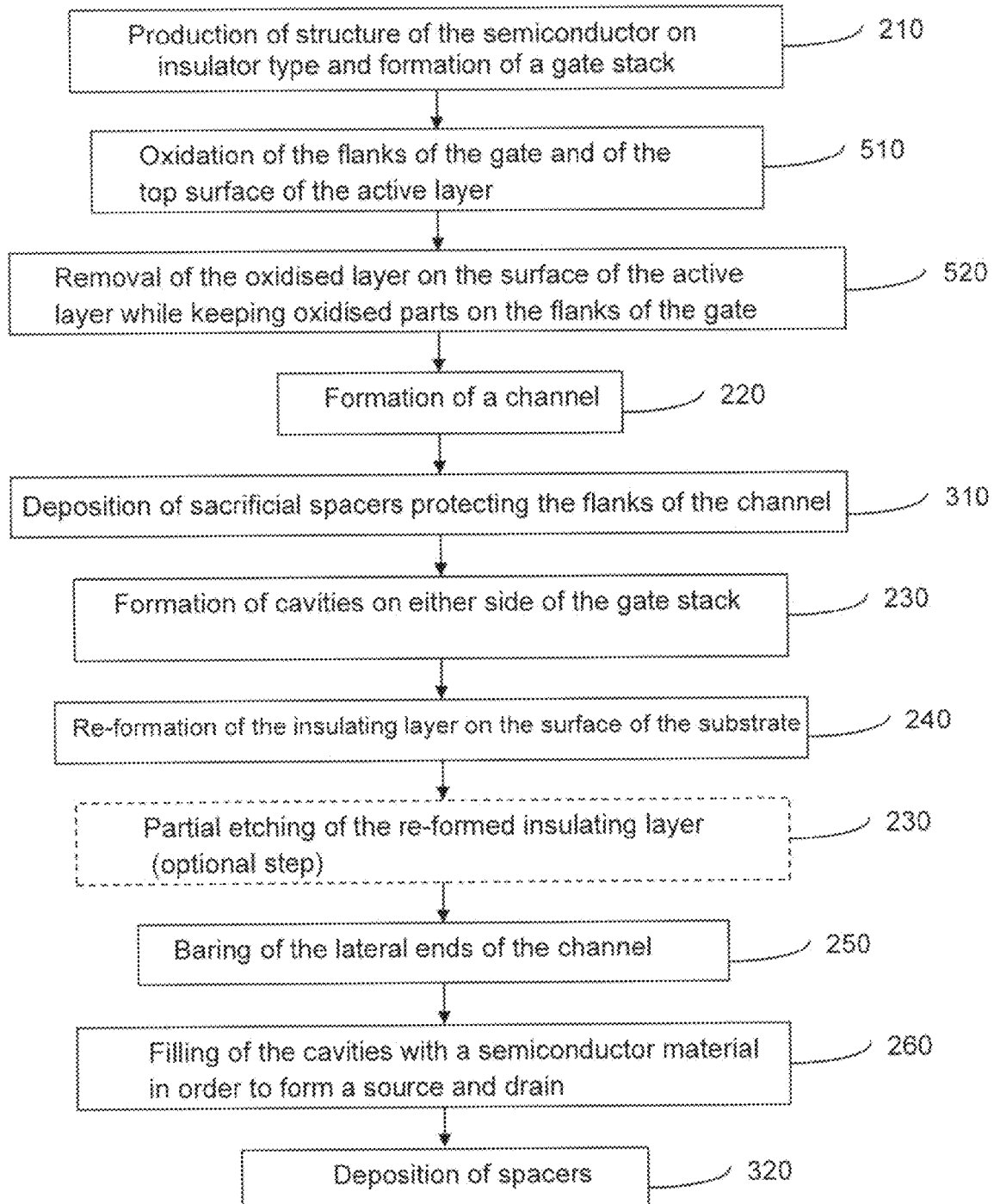
FIG. 10 summarises the steps of manufacturing transistors according to the fourth embodiment of the invention.

FIG. 9a shows the structure 500 obtained at the end of step 210. According to this fourth embodiment, the substrate 112 can advantageously be doped or non-doped. At this stage no spacer 410 is produced for protecting the flanks of the gate stack 160.

Figure 9B:
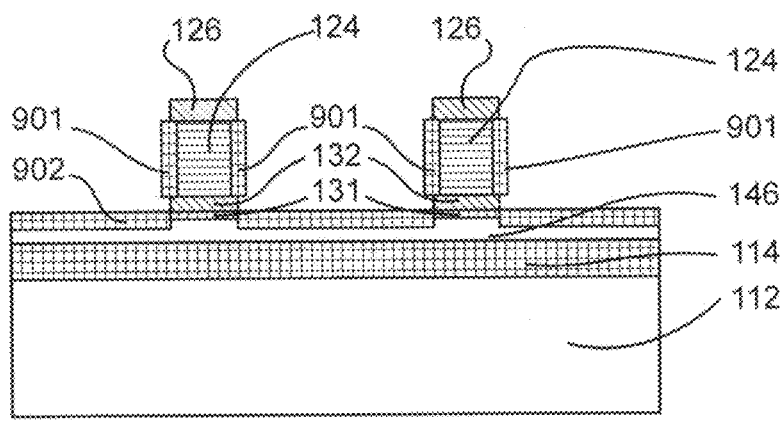

FIG. 9b shows the structure obtained at the end of step 510. At this stage, flanks of the gate 124 and top parts of the active layer 146 with the exception of the regions situated below the gate stack 160 are oxidised preferably by thermal oxidation. These oxidations form, on the flanks of the gate 124, the layers referenced 901 in FIG. 9b and form, on the surface of the substrate 112, the layer referenced 902. Advantageously, a wide choice of oxidation methods can be used. This is because there is no need to use oxidation methods preferential of one layer with respect to another. The thickness of the oxidised parts is preferably between 1 and 5 nm.

Figure 9C:
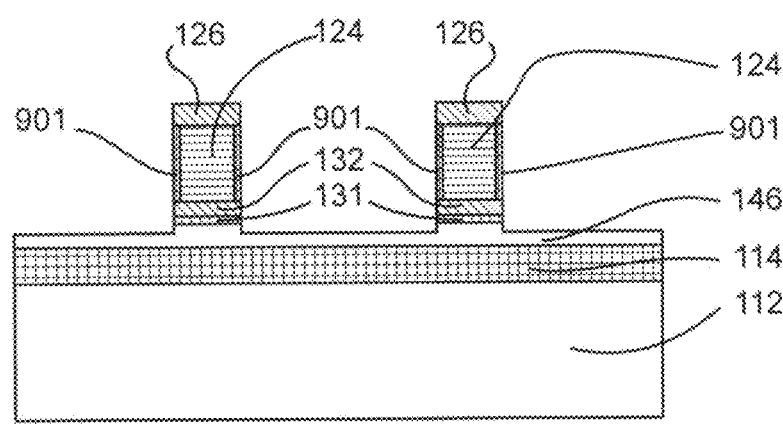

FIG. 9c shows the structure obtained at the end of step 520. An anisotropic etching (preferably perfectly anisotropic) the favoured direction of which is perpendicular to the plane of the substrate 112 is performed. This etching is selective with respect to the hard mask 126. It is therefore auto-aligned on the gate 124. The entire thickness of oxide 902 present at the surface of the substrate 112 is removed. On the other hand, the oxidised part 901 present on the flanks of the gate 124 and situated below the hard mask 126 (and therefore protected by the latter) is not etched. Oxide 901 thus remains on the flanks of the gate 124.

For example, an etching of the RIE type can be used.

Figure 9D:
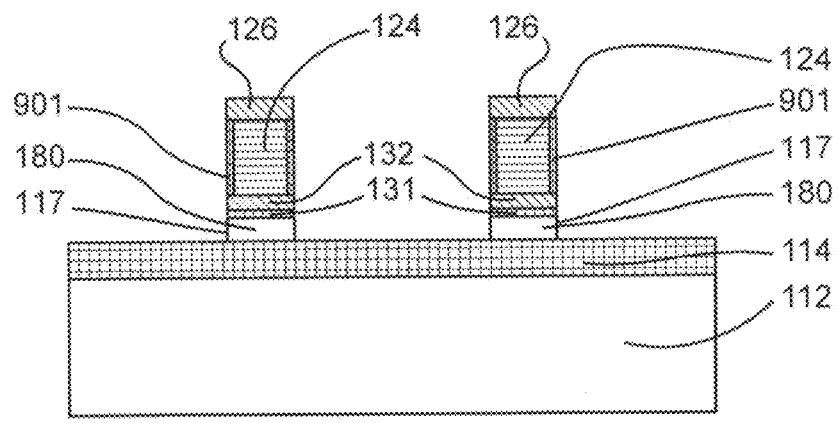
Figure 9E:
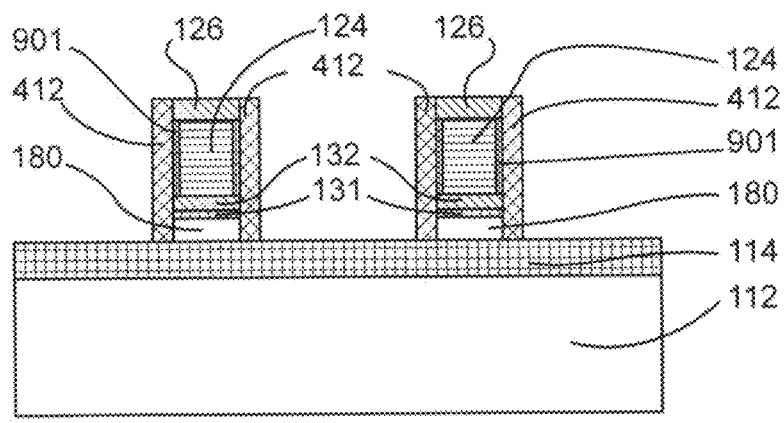
Figure 9F:
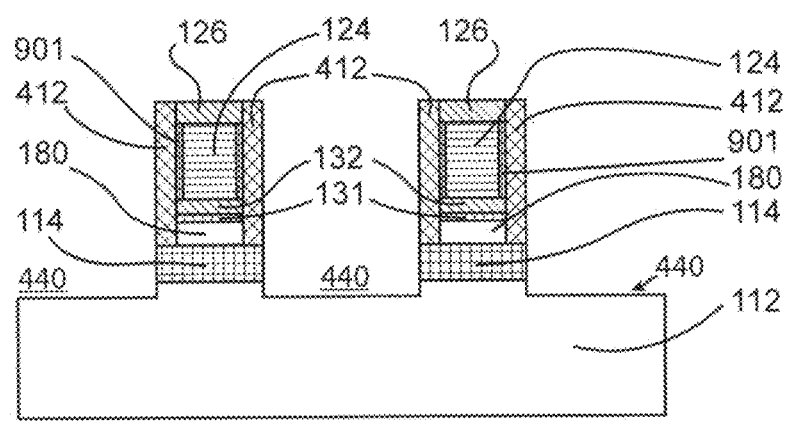
Figure 9G:
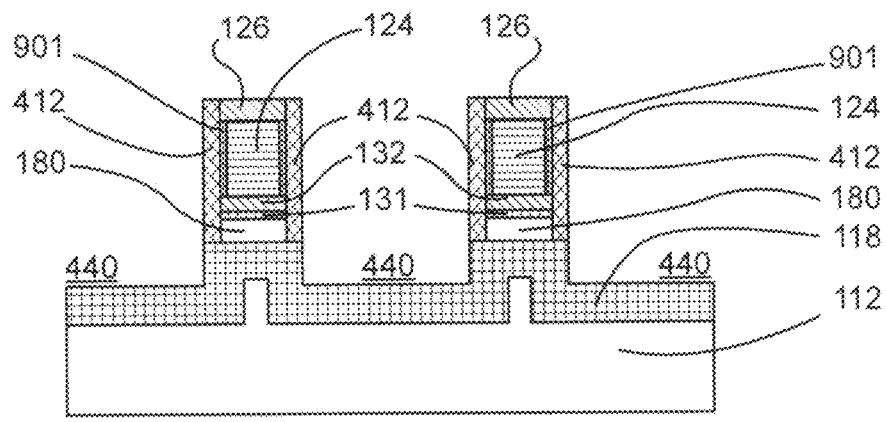
Figure 9H:
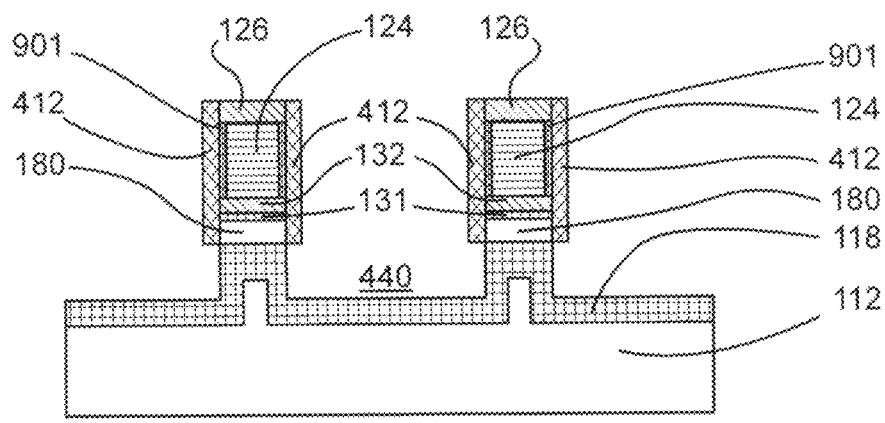
Figure 9I:
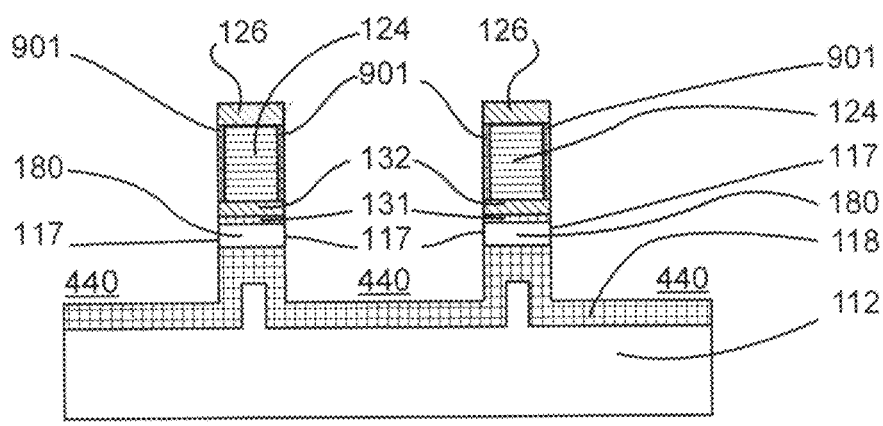

FIG. 9d shows the structure obtained at the end of step 220 of formation of the channel 180. An RIE etching is performed in order to remove the remaining thickness of the parts of the bared active layer 146, that is to say the parts that are not situated below the gate stack 160. The portions of the active layer 146 protected by the hard mask 126 remain in place and are intended to form the channels 180 of the transistors 500.

FIGS. 9e, 9f, 9g, 9h, 9i show respectively the gate structures at the end of steps 310, 230, 240, 230 and 250. The descriptions concerning these steps are respectively identical to those concerning the performance of steps 310, 230, 240, 230 and 250 of the third embodiment being presented respectively in FIGS. 7c, 7d, 7e, 7f, 7g. Thus the structure obtained at the end of these steps has a substrate 112 surmounted by an uninterrupted insulating layer 118 at least for a transistor 500. The gate stack 160 has on either side cavities 440 electrically insulated from the substrate 112 by the re-formed insulating layer 118. The channel 180 of each transistor 500 is disposed at the top of the relief formed between two successive cavities 440. The lateral ends 117 of the channel 180 are bared. A layer of oxide 901 covers the flanks of the gate 124.

Figure 9J:
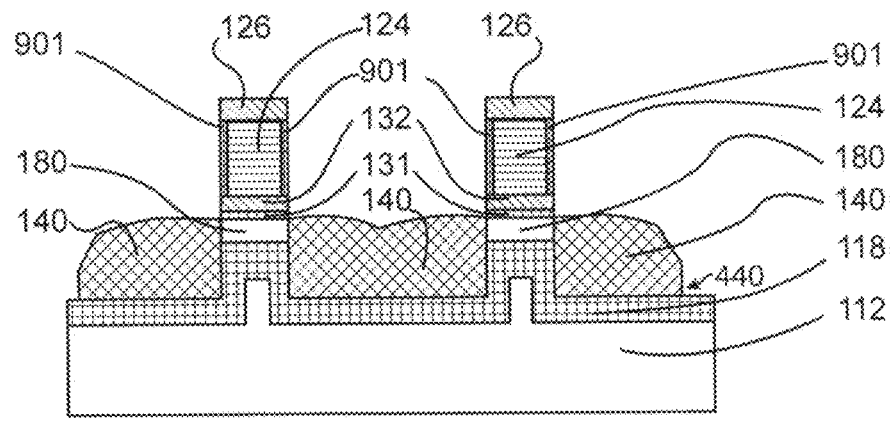
Figure 9K:
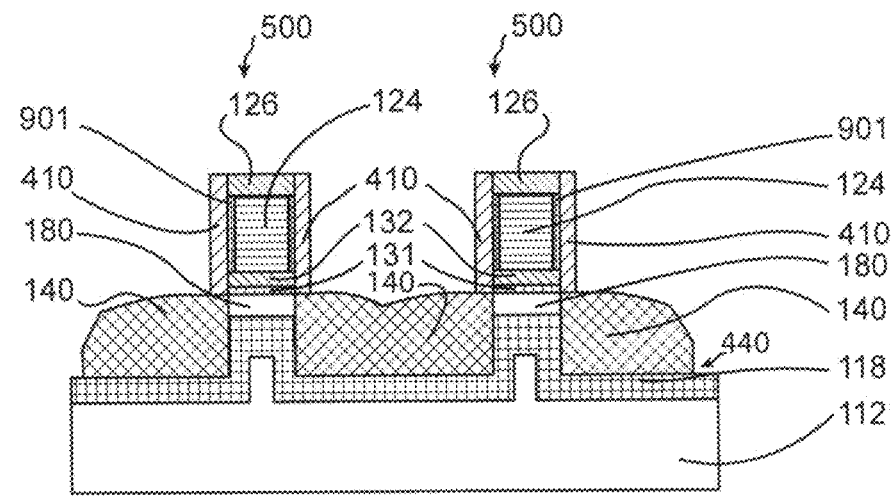

FIG. 9j shows the structure obtained at the end of the step 260 of formation of the source and drain 140. The cavities 440 are filled by epitaxy initiated by the semiconductor material of the channel 180. It should be noted that, since the flanks of the gate are protected by the layer of oxide 901, there is no epitaxy that forms on the flanks of the gate 124, as was the case with the previous embodiment.

The features indicated in the description of the embodiment illustrated in FIG. 4 with regard to this step 260 of filling the cavities 440, the etching depth and doping of the source and drain regions 140, are valid for this embodiment illustrated in FIG. 9j.

After epitaxy, spacers 410 are preferably produced, as have been indicated with regard to step 320 illustrated in FIG. 7i.

As with the previous method, the method illustrated in FIGS. 9 and 10 has the advantage of being able to use a doped or non-doped substrate 112. Moreover, the channel is protected during the oxidation used to re-form the insulating layer 118. This method also avoids epitaxial growth from the flanks of the gate 124. The source and drain 140 are auto-aligned with the gate.

FIGS. 11a to 11h describe steps of a fifth embodiment according to the method of the invention. FIG. 12 summarises the steps of manufacturing a transistor 600 according to the fifth embodiment of the invention. FIGS. 11a, 11b, 11f, 11g and 11h, corresponding respectively to steps 210, 220 and 230, 240, 250 and 260 of FIG. 3, have already been described in the description of the first embodiment.

In this embodiment, a continuous insulating layer 118 is re-formed by oxidation whereas the lateral ends 117 of the channel 180 are not protected. For this purpose the surface of the substrate 112 is made porous and preferential oxidation of the porous semiconductor material of the substrate 112 is effected with respect to the nonporous semiconductor material forming the channel 180.

To make the surface of the substrate 112 porous, it is necessary at least for the current to be able to pass through the substrate 112. The substrate 112 is therefore preferentially a doped substrate, the doping level of which is high, in order to ensure passage of the current and to be able then to preferentially oxidise the substrate 112 in a subsequent step. The doping nature and level for their part modify the morphology of the pores.

Figure 11A:
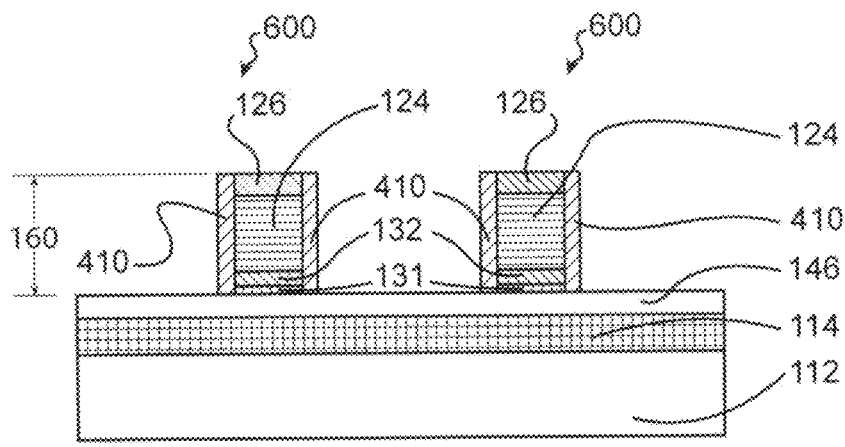
FIGS. 11a to 11h describe specific steps of the transistor manufacturing method according to a fifth embodiment of the invention, FIG. 11h illustrating an example of a transistor according to the invention once finalised.
Figure 11B:
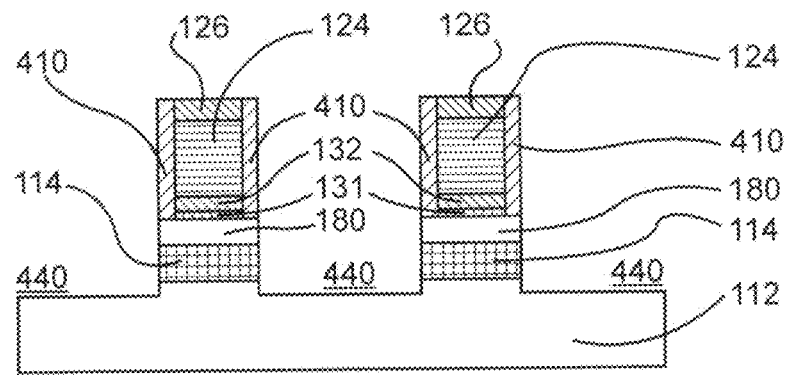
Figure 12:
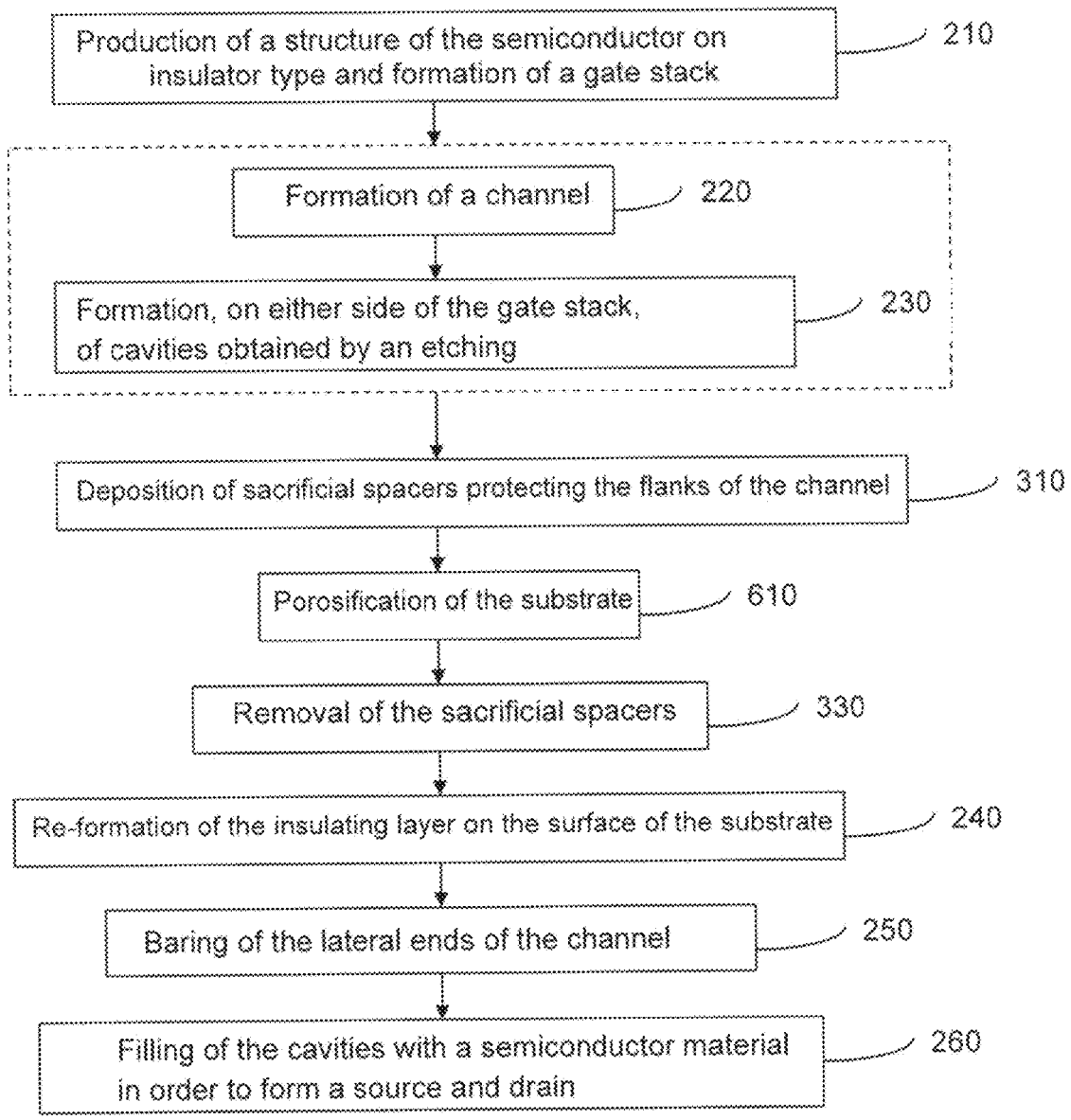
FIG. 12 summarises the steps of manufacturing transistors according to the fifth embodiment of the invention.

FIGS. 11a and 11b show respectively the structures at the end of steps 210, 220 and 230. The descriptions concerning these steps are respectively similar/identical to those concerning the implementation of steps 210, 220 and 230 of the first embodiment, steps presented respectively in FIGS. 4a and 4b. As in the first embodiment, the formation of the channel 180 (step 220) and the formation no either side of the gate stack 160 and cavities 440 (step 230) are performed by an auto-aligned anisotropic etching with respect to the gate stack 160. A single etching is preferably performed to etch the active layer 146, the initial insulating layer 114 and optionally a portion of the substrate 112. As with the previous embodiments, this etched thickness in the substrate 112 is advantageously between 5 and 50 nm.

Figure 11C:
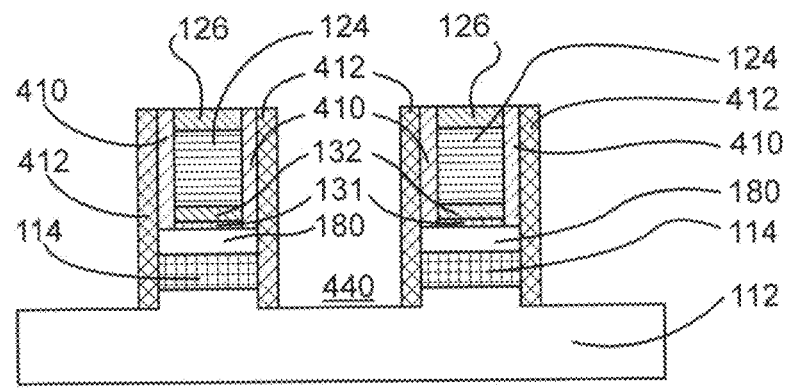

FIG. 11c shows the structure obtained at the end of the step 310 of deposition of sacrificial spacers 412. The sacrificial spacers 412 must be deposited in the vertical direction with respect to the substrate 112 in order to cover the bare flanks of the spacers 410, of the channel 180. They may also cover the flanks of the remaining portions of the initial insulating layer 114. The material of the sacrificial spacers 412 must be selective to the etching with respect to the spacers 410, the hard mask 120 and the substrate 112.

Figure 11D:
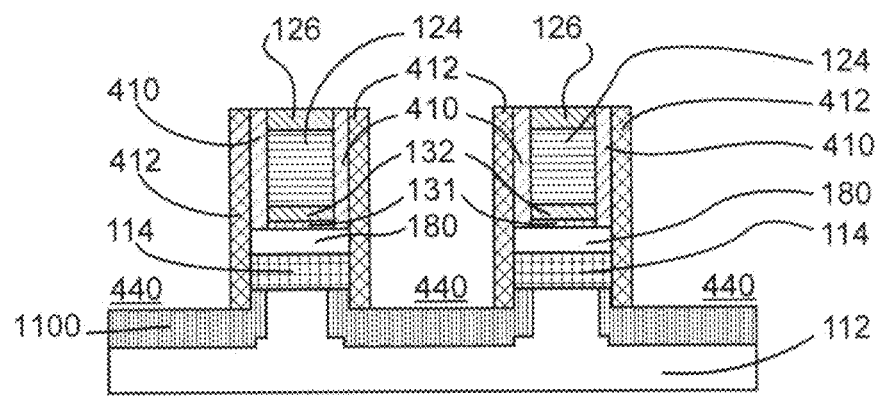

FIG. 11d shows the gate structure at the end of the step 610 of porosification of the substrate 112. The sacrificial spacers 412 protect the flanks of the channel 180 and those of the initial insulating layer 114, which are therefore not affected by this porosification. In addition, the channel 180 is electrically insulated by the initial insulating layer 114. Thus the channel 180 does not become porous and only the substrate 112 is locally porous. The surface layer of the substrate 112 made porous is referenced 1100 in FIGS. 11d and 11e. This porosification step is for example an electrolytic porosification by hydrofluoric acid. The size of the pores is for example 5 nm.

Figure 11E:
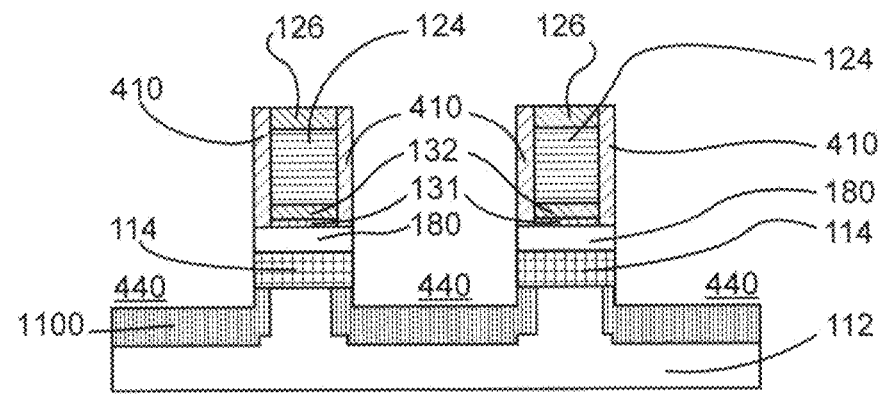

FIG. 11e shows the structure obtained at the end of step 330 of removing the sacrificial spacers 412. This step is performed by selective etching of the sacrificial spacers 412 with respect to the spacers 410, the hard mask 126 and the substrate 112 made porous.

Figure 11F:
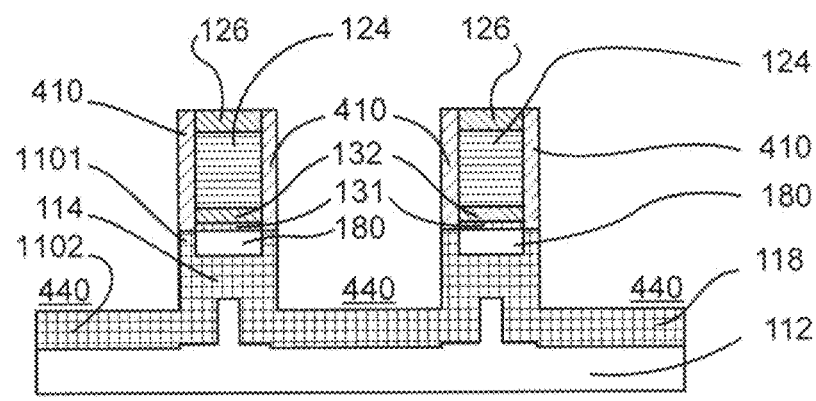

FIG. 11f shows the structure obtained at the end of the step 240 of re-formation of an uninterrupted insulating layer 118 on the surface of the substrate 112. At this stage, the lateral ends 117 of the channel 180 are uncovered. They are therefore affected by the oxidation. On the other hand, the oxidation kinetics of the non-porous semiconductor material is lower than that of the porous semiconductor material 1100 covering the substrate 112. The oxidation is therefore an oxidation preferentially of the semiconductor material of the substrate 112 with respect to the semiconductor material of the channel 180. Preferably, an oxidation of the dry type is effected in order to form a small thickness of oxide 1101 at the channel 180. The oxidation 1102 of the substrate 112 is preferably at least twice as great as that 1101 of the channel 180.

Figure 11G:
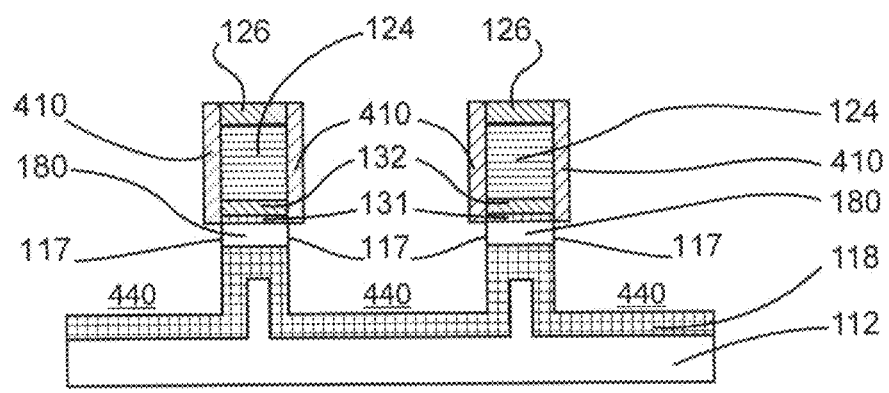
Figure 11H:
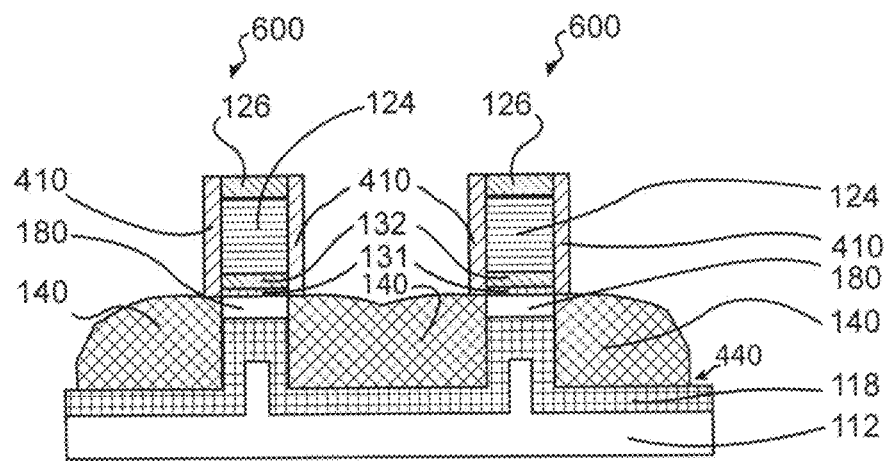

FIGS. 11g and 11h show the gate structures at the end of steps 250 and 260. The descriptions concerning these steps are identical to those concerning the performance of steps 250 and 260 of the first embodiment, steps described with reference to FIGS. 4d and 4e. Thus at these steps the lateral ends 117 of the channel 180 are cleared and the source and drain regions are formed by epitaxy from the channel 180. The features indicated in the description of the embodiment illustrated in FIG. 4 with regard to these steps 250 and 260, of baring the channel 180, filling the cavities 440, the etching depth and the doping of the source and drain regions 140 are valid for this embodiment illustrated in FIGS. 11g and 11h.

In addition it should be noted that this embodiment also has the advantage, like the embodiment illustrated in FIG. 4, of having spacers 410 that block growth of the epitaxy upwards from the channel 180. This embodiment therefore facilitates downward growth by virtue of the existence of the spacers 410 which overhang the lateral ends 117 of the channel 180. Advantageously the source and drain 140 are auto-aligned with the gate 124.

The above detailed description clearly shows that the invention proposed is an effective solution for reducing the access resistance of the electrodes of the S/Ds without degrading the performances of the transistor, in particular in terms of speed.

One significant advantage that it has lies in the fact that the height of the S/Ds is independent of the thickness of the active layer forming the channel.

Furthermore, the invention makes it possible to auto-align the cavities and the therefore S/Ds around the gate stack.

The invention is not limited to the embodiments described above but extends to any embodiment falling within the scope defined by the claims.

The invention claimed is:

1. A method for manufacturing a transistor comprising formation of a stack of layers of a semiconductor on insulator type, comprising at least one substrate, surmounted by a first insulating layer and an active layer intended to form a channel for the transistor, the method further comprising formation of a gate stack on the active layer and production of a source and drain, characterised in that the production of the source and drain comprises at least the following steps:
   formation, on either side of the gate stack, of cavities by at least one step of etching the active layer, the first insulating layer and part of the substrate selectively to the gate stack at least so as to remove, outside regions situated below the gate stack, the entire active layer uncovered, the first insulating layer and a portion of the substrate;
   formation of a second insulating layer comprising formation, by oxidation of the substrate, of an insulating film over all surfaces of the substrate bared by said etching, so that the insulating film forms, with the first insulating layer, an insulating layer continuous from one cavity of the transistor to another;
   baring of lateral ends of the channel formed by the portion of active layer left in place under the gate stack;
   filling of the cavities by a semiconductor material by epitaxy from the lateral ends of the channel so as to form the source and drain.

2. The method according to claim 1, wherein the formation of the insulating film comprises the oxidation of all the bared surfaces of the active layer situated below the gate stack.

3. The method according to claim 1, in which the second insulating layer is continuous over a whole of the substrate or at least for a plurality of transistors.

4. The method according to claim 1, wherein the cavities each have a bottom formed by the substrate and the cavities are filled from the channel towards the bottom of the cavities.

5. The method according to claim 1, comprising, after the step of oxidation of the substrate, a step of partial etching of the second insulating layer.

6. The method according to claim 5 wherein the epitaxy is performed so that a thickness of the source and drain produced by epitaxy each has a dimension Ep(epi) substantially equal to Ep(etched1)−0.54·EP(oxide)+Ep(etched2), where: Ep(etched1) corresponds to a thickness etched during the formation of the cavities; EP(oxide) corresponds to a thickness of the insulating film form by oxidation of the substrate; Ep(etched2) corresponds to a thickness etched during the step of partial etching of the second insulating layer.

7. The method according to claim 1, wherein the step of formation of the second insulating layer by oxidation of the substrate comprises the oxidation of the lateral ends of the channel.

8. The method according to claim 7, wherein the oxidation step is performed so that an oxidised width of the lateral ends of the channel is less than an oxidised thickness of the substrate.

9. The method according to claim 8, wherein the oxidation step is performed so that the thickness of the oxidised substrate is at least twice as great as the oxidised width of the lateral ends of the channel.

10. The method according to claim 8, comprising, after the oxidation step, a step of partial isotropic etching of the second insulating layer, the partial etching being performed so as to bare the lateral ends of the channel and so that the second insulating layer remains uninterrupted from one cavity of the transistor to another.

11. The method according to claim 5, comprising, prior to the step of formation of the cavities a step of formation of at least one protective layer disposed on flanks of the gate, the partial etching of the second insulating layer being selective of said protective layer so that, after the step of partial etching, the lateral ends of the channel are recessed with respect to the protective layer.

12. The method according to claim 11, wherein the oxidation step is performed so that an oxidised width of the lateral ends of the channel is less than or equal to a width of the protective layer disposed on the flanks of the gate.

13. The method according to claim 10, wherein the step of formation of the second insulating layer comprises a step of thermal oxidation of the substrate preferentially to the channel.

14. The method according to claim 13, wherein the substrate has a doping greater than the active layer and wherein the doping of the substrate favours the oxidation of the substrate with respect to the oxidation of the channel.

15. The method according to claim 1, wherein the step of formation of the second insulating layer comprises the following steps:
   after the formation of the cavities, formation of at least one sacrificial protective layer masking the flanks of the gate stack, the lateral ends of the channel and flanks of the first insulating layer, the sacrificial protective layer leaving bare the substrate in a bottom of the cavities, the sacrificial protective layer being chosen so as to insulate at least the channel from an electrolytic porosification;
   electrolytic porosification of the substrate;
   baring of the lateral ends of the channel by removal of the sacrificial protective layer;
   thermal oxidation of the substrate preferentially to the channel.

16. The method according to claim 15, comprising, prior to the porosification step, a step of doping of the substrate.

17. The method according to claim 1, comprising, prior to the step of formation of the second insulating layer, a step of formation of a sacrificial protective layer disposed so as to protect at least the lateral ends of the channel during the oxidation step in order to form the second insulating layer and comprising, before the step of filling the cavities, a step of removal of the sacrificial protective layer in order to bare the lateral ends of the channel.

18. The method according to claim 17, wherein the formation of the cavities comprises a step of etching of the active layer selective of the gate stack with stoppage of the etching on the surface of the first insulating layer and a step of etching the first insulating layer with stoppage on or in the substrate, wherein the step of formation of the sacrificial protective layer is performed after said step of etching the active layer and before said step of etching of the first insulating layer.

19. The method according to claim 18, wherein the oxidation step is performed so that a thickness of the oxidised substrate is at least twice as great as a width of the sacrificial protective layer.

20. The method according to claim 17, wherein the substrate is made from non-doped semiconductor material.

21. The method according to claim 17, comprising, after the oxidation step for forming the second insulating layer, a step of partial etching of the second insulating layer.

22. The method according to claim 21, wherein the step of partial etching of the second insulating layer is an isotropic etching and an etched thickness is at least equal to a width of the sacrificial protective layer.

23. The method according to claim 22, wherein the step of removal of the sacrificial protective layer is performed before said step of partial etching of the second insulating layer.

24. The method according to claim 21, wherein the step of removal of the sacrificial protective layer is performed after said step of partial etching of the second insulating layer.

25. The method according to claim 24, wherein the step of removal of the sacrificial protective layer is performed before the step of filling the cavities, the method further comprising, after the step of filling the cavities, a step of formation of at least one spacer on either side of the gate stack and in contact with the gate stack.

26. The method according to claim 25, wherein the sacrificial protective layer is disposed directly in contact with flanks of the gate stack.

27. The method according to claim 26, wherein the flanks of the gate are bared at a start of the filling step, crystalline structures of the gate and channel are different and wherein the step of filling the cavities comprises a plurality of cycles each comprising:
   an epitaxy initiated from the channel and from the flanks of the gate;
   an etching of a material in epitaxial growth from the flanks of the gate selectively to the material in epitaxial growth from the channel.

28. The method according to claim 24 comprising, before the step of formation of the sacrificial protective layer, a step of protection of flanks of the gate comprising an oxidation of flanks of the gate, the flanks of the gate preserving an oxidised layer during the step of filling the cavities.

29. The method according to claim 28, wherein the formation of the gate stack comprises a step of formation of a hard mask on a gate made from semiconductor material, wherein the step of protection of the flanks of the gate comprises, after formation of the gate stack and before etching of the active layer, a step of thermal oxidation of the flanks of the gates and of a portion of the active layer, and a step of anisotropic etching of the oxide formed during the step of protection of the flanks of the gate selectively to the hard mask so as to remove a layer of oxide on the active layer and to preserve a layer of oxide in line with the hard mask on the flanks of the gate.

30. The method according to claim 29, comprising, after the step of anisotropic etching to preserve a layer of oxide on the flanks of the gate, a step of anisotropic etching of the active layer with stoppage on the first insulating layer in order to remove the active layer on either side of the gate stack so as to bare the lateral ends of the channel, and then the step of formation of the sacrificial protective layer is performed so as to protect the lateral ends of the channel during the etching of the first insulating layer in order to form the cavities.

31. The method according to claim 30, wherein a thickness of oxide formed during the oxidation step to form the second insulating layer is greater than or equal to a width of the sacrificial protective layer.

32. A method according to claim 1, wherein, at the cavities, a top face of insulating film is situated below a bottom face of the active layer forming the channel.

* * * * *

UNITED STATES PATENT AND TRADEMARK OFFICE
CERTIFICATE OF CORRECTION

| | |
|---|---|
| PATENT NO. | : 8,980,702 B2 |
| APPLICATION NO. | : 14/177614 |
| DATED | : March 17, 2015 |
| INVENTOR(S) | : Heimanu Niebojewski et al. |

Page 1 of 1

It is certified that error appears in the above-identified patent and that said Letters Patent is hereby corrected as shown below:

On the title page, Item (73), the Assignees information is incorrect. Item (73) should read:

-- (73)　　Assignees:　　Commissariat a l'Energie Atomique et aux Energies Alternatives, Paris (FR); Stmicroelectronics (Crolles 2) SAS, Crolles (FR); Stmicroelectronics SA, Montrouge (FR) --

Signed and Sealed this
Fifteenth Day of December, 2015

Michelle K. Lee
*Director of the United States Patent and Trademark Office*